(12) United States Patent
Negoro et al.

(10) Patent No.: US 12,212,873 B2
(45) Date of Patent: Jan. 28, 2025

(54) IMAGING DEVICE AND ELECTRONIC DEVICE

(71) Applicant: Semiconductor Energy Laboratory Co., Ltd., Atsugi (JP)

(72) Inventors: Yusuke Negoro, Kaizuka (JP); Hideaki Shishido, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 103 days.

(21) Appl. No.: 18/024,084

(22) PCT Filed: Sep. 13, 2021

(86) PCT No.: PCT/IB2021/058290
§ 371 (c)(1),
(2) Date: Mar. 1, 2023

(87) PCT Pub. No.: WO2022/064317
PCT Pub. Date: Mar. 31, 2022

(65) Prior Publication Data
US 2023/0396899 A1    Dec. 7, 2023

(30) Foreign Application Priority Data

Sep. 25, 2020   (JP) ................................ 2020-160663

(51) Int. Cl.
*H04N 25/79* (2023.01)
*H04N 25/77* (2023.01)
*H04N 25/78* (2023.01)

(52) U.S. Cl.
CPC ............. *H04N 25/79* (2023.01); *H04N 25/77* (2023.01); *H04N 25/78* (2023.01)

(58) Field of Classification Search
None
See application file for complete search history.

(56) References Cited

U.S. PATENT DOCUMENTS 7,495,206 B2 * 2/2009 Park ................. H01L 27/14634
438/668
7,947,528 B2   5/2011 Iwabuchi et al.
(Continued)

FOREIGN PATENT DOCUMENTS

CN   101228631 A   7/2008
CN   104662662 A   5/2015
(Continued)

OTHER PUBLICATIONS

JP2016-213298; Ikeda Takayuki; "Imaging Device and Electronic Apparatus"; Dec. 15, 2016; pp. 1-46; English Translation (Year: 2016).*

(Continued)

*Primary Examiner* — Cynthia Segura
(74) *Attorney, Agent, or Firm* — Eric J. Robinson; Robinson Intellectual Property Law Office, P.C.

(57) ABSTRACT

The present invention relates to a highly functional imaging device that can be manufactured through a small number of steps. The imaging device is formed in such a manner that a first stacked body in which a plurality of devices are stacked and a second stacked body in which a plurality of devices are stacked are bonded to each other. For example, a pixel circuit, a driver circuit of a pixel, and the like can be provided in the first stacked body, and a reading circuit of the pixel circuit, a memory circuit, a driver circuit of the memory circuit, and the like can be provided in the second stacked body. With these structures, the imaging device which is small can be formed. Furthermore, wiring delay or the like can be prevented by stacking circuits, so that high-speed operation can be performed.

10 Claims, 25 Drawing Sheets

(56) References Cited

U.S. PATENT DOCUMENTS

| | | | |
|---|---|---|---|
| 8,049,293 | B2 | 11/2011 | Iwabuchi et al. |
| 8,309,392 | B2 | 11/2012 | Iwabuchi et al. |
| 8,378,391 | B2 | 2/2013 | Koyama et al. |
| 8,440,499 | B2 | 5/2013 | Iwabuchi et al. |
| 8,841,743 | B2 | 9/2014 | Iwabuchi et al. |
| 8,916,869 | B2 | 12/2014 | Koyama et al. |
| 8,946,610 | B2 | 2/2015 | Iwabuchi et al. |
| 9,117,710 | B2 | 8/2015 | Iwabuchi et al. |
| 9,293,496 | B2 * | 3/2016 | Kashihara .......... H01L 27/14634 |
| 9,331,112 | B2 | 5/2016 | Koyama et al. |
| 9,362,325 | B2 | 6/2016 | Baba et al. |
| 9,607,971 | B2 * | 3/2017 | Asayama ............... H04N 25/75 |
| 9,666,626 | B2 * | 5/2017 | Kishi ................ H01L 27/14634 |
| 9,673,249 | B2 | 6/2017 | Iwabuchi et al. |
| 9,748,291 | B2 * | 8/2017 | Ikeda ................ H01L 27/14659 |
| 9,773,814 | B2 | 9/2017 | Koyama et al. |
| 9,818,784 | B2 | 11/2017 | Baba et al. |
| 9,905,598 | B2 * | 2/2018 | Yamazaki ......... H01L 27/14612 |
| 9,955,097 | B2 | 4/2018 | Iwabuchi et al. |
| 10,129,497 | B2 | 11/2018 | Iwabuchi et al. |
| 10,431,620 | B2 | 10/2019 | Baba et al. |
| 10,594,972 | B2 | 3/2020 | Iwabuchi et al. |
| 10,645,324 | B2 | 5/2020 | Iwabuchi et al. |
| 11,025,844 | B2 * | 6/2021 | Seo ....................... H04N 25/771 |
| 11,043,532 | B2 | 6/2021 | Yokoyama et al. |
| 11,152,418 | B2 * | 10/2021 | Kameshima ............ H01L 21/02 |
| 11,228,728 | B2 | 1/2022 | Iwabuchi et al. |
| 11,302,736 | B2 * | 4/2022 | Yoneda ................... H04N 25/79 |
| 11,569,287 | B2 | 1/2023 | Baba et al. |
| 12,081,882 | B2 * | 9/2024 | Kuriyama ............. H04N 25/583 |
| 2006/0146233 | A1 * | 7/2006 | Park .................... H01L 27/1464 349/95 |
| 2010/0276572 | A1 * | 11/2010 | Iwabuchi ............... H04N 25/76 257/443 |
| 2015/0221694 | A1 | 8/2015 | Baba et al. |
| 2015/0263053 | A1 * | 9/2015 | Yamazaki ......... H01L 27/14643 257/43 |
| 2016/0247851 | A1 | 8/2016 | Baba et al. |
| 2017/0041517 | A1 * | 2/2017 | Ikeda ..................... H04N 23/54 |
| 2017/0195602 | A1 | 7/2017 | Iwabuchi et al. |
| 2018/0053802 | A1 | 2/2018 | Baba et al. |
| 2018/0240797 | A1 * | 8/2018 | Yokoyama ............. H10B 61/22 |
| 2019/0363129 | A1 | 11/2019 | Yokoyama et al. |
| 2020/0006416 | A1 | 1/2020 | Baba et al. |
| 2021/0104572 | A1 * | 4/2021 | Kameshima .......... H01L 23/522 |
| 2021/0375966 | A1 * | 12/2021 | Baba ...................... H04N 25/75 |
| 2022/0124270 | A1 | 4/2022 | Iwabuchi et al. |
| 2022/0320172 | A1 * | 10/2022 | Negoro ............... H01L 21/8234 |

FOREIGN PATENT DOCUMENTS

| | | | |
|---|---|---|---|
| CN | 110168725 A | | 8/2019 |
| JP | 2011-119711 A | | 6/2011 |
| JP | 2016213298 A | * 12/2016 | ............ H01L 21/02 |
| JP | 2018-037441 A | | 3/2018 |
| JP | 2018-117102 A | | 7/2018 |
| JP | 2020-123612 A | | 8/2020 |
| KR | 2008-0019652 A | | 3/2008 |
| KR | 2015-0058229 A | | 5/2015 |
| KR | 2019-0105575 A | | 9/2019 |
| TW | 200709407 | | 3/2007 |
| TW | 201413926 | | 4/2014 |
| TW | 201841344 | | 11/2018 |
| WO | WO-2006/129762 | | 12/2006 |
| WO | WO-2014/050694 | | 4/2014 |
| WO | WO-2018/135194 | | 7/2018 |

OTHER PUBLICATIONS

International Search Report (Application No. PCT/IB2021/058290) Dated Dec. 14, 2021.

Written Opinion (Application No. PCT/IB2021/058290) Dated Dec. 14, 2021.

* cited by examiner

FIG. 8A

| | | | | | | | |
|---|---|---|---|---|---|---|---|
| Line[1] | Rn-1 | En | | Rn | En+1 | | |
| Line[2] | En-1 | Rn-1 | En | Rn | En+1 | | |
| Line[3] | En-1 | Rn-1 | En | Rn | | En+1 | |
| ⋮ | | | | | | | |
| Line[M] | En-1 | Rn-1 | En | | Rn | | |

FIG. 8B

| | | | | | |
|---|---|---|---|---|---|
| Line[1] | En | Rn | | | En+1 |
| Line[2] | En | | Rn | | En+1 |
| Line[3] | En | | Rn | | En+1 |
| ⋮ | | | | | |
| Line[M] | En | | | Rn | En+1 |

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

With the technological development, a high-quality image can be easily captured with an imaging device such as a CMOS image sensor. In the next generation, an imaging device is required to be more highly functional.

In contrast, an imaging device is also required to reduce its size because the imaging device is incorporated into a variety of devices. Thus, even in the case where a function is added, a sensor chip is desired to be miniaturized. Accordingly, a component to add a function to an imaging device is preferably provided to be stacked.

However, in the case where a plurality of semiconductor devices are stacked, a polishing step, a bonding step, and the like are required to be performed a plurality of times. Thus, improvement in the yield is a challenge.

In view of the above, an object of one embodiment of the present invention is to provide a highly functional imaging device. Another object is to provide an imaging device that can be manufactured through a small number of steps. Another object is to provide an imaging device that can be manufactured with a high yield. Another object is to provide a small imaging device. Another object is to provide an imaging device or the like capable of high-speed operation. Another object is to provide an imaging device with high reliability. Another object is to provide a novel imaging device or the like. Another object is to provide a method for driving the above imaging device. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to a highly functional imaging device that can be manufactured through a small number of steps.

One embodiment of the present invention is an imaging device including a photoelectric conversion device, a pixel circuit, a memory circuit, a reading circuit, a first insulating layer, a second insulating layer, a first conductive layer, and a second conductive layer. The photoelectric conversion device is electrically connected to the pixel circuit. The memory circuit is electrically connected to the reading circuit. The first insulating layer is provided over the memory circuit. The first conductive layer includes a region embedded in the first insulating layer. The first conductive layer is electrically connected to the pixel circuit. The second insulating layer is provided over the pixel circuit. The second conductive layer includes a region embedded in the second insulating layer. The second conductive layer is electrically connected to the reading circuit. The first conductive layer and the second conductive layer are directly bonded to each other. The first insulating layer and the second insulating layer are directly bonded to each other. The memory circuit includes memory cells for the number of bits that the reading circuit outputs. The memory cell includes a capacitor including a ferroelectric layer.

The pixel circuit and the memory circuit each include a transistor including a metal oxide in a channel formation region. The reading circuit includes a transistor including silicon in a channel formation region. The photoelectric conversion device can be a photodiode including silicon in a photoelectric conversion layer.

Alternatively, the pixel circuit, the memory circuit, and the reading circuit each include a transistor including silicon in a channel formation region. The photoelectric conversion device can be a photodiode including silicon in a photoelectric conversion layer.

The first conductive layer and the second conductive layer are preferably formed using the same metal material, and the first insulating layer and the second insulating layer are preferably formed using the same insulating material.

The metal oxide can include In, Zn, and M (M is one or more of Al, Ti, Ga, Ge, Sn, Y, Zr, La, Ce, Nd, and Hf).

It is preferable that the ferroelectric layer be a metal oxide including Hf and Zr.

Effect of the Invention

With the use of one embodiment of the present invention, a highly functional imaging device can be provided. An imaging device that can be manufactured through a small number of steps can be provided. An imaging device that can be manufactured with a high yield can be provided. A small imaging device can be provided. An imaging device or the like capable of high-speed operation can be provided. An imaging device with high reliability can be provided.

A novel imaging device or the like can be provided. A method for driving the above imaging device can be provided. A novel semiconductor device or the like can be provided.

BRIEF DESCRIPTION OF THE DRAWINGS

FIG. 8A is a diagram showing a rolling shutter operation. FIG. 8B is a diagram showing a global shutter operation.

MODE FOR CARRYING OUT THE INVENTION

Figure 1:
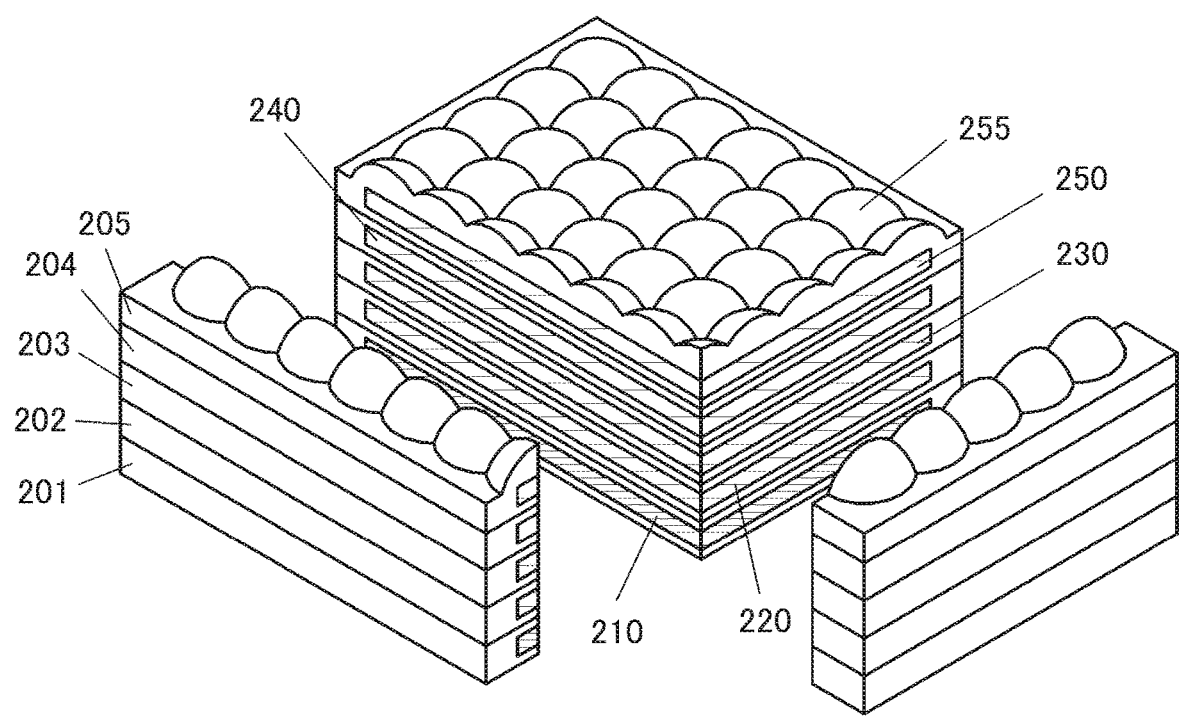
FIG. 1 is a cross-sectional perspective view illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a configuration is included in direct connection.

Embodiment 1

In this embodiment, an imaging device of one embodiment of the present invention is described with reference to drawings.

One embodiment of the present invention is an imaging device including a plurality of stacked devices. The imaging device is formed in such a manner that a first stacked body in which a plurality of devices are stacked and a second stacked body in which a plurality of devices are stacked are bonded to each other. Thus, even when a structure is employed in which a plurality of circuits having different functions are stacked, the number of polishing steps and bonding steps can be reduced, improving the yield.

For example, a pixel circuit, a driver circuit of a pixel, and the like can be provided in the first stacked body, and a reading circuit of the pixel circuit, a memory circuit, a driver circuit of the memory circuit, and the like can be provided in the second stacked body. With these structures, the imaging device which is small can be formed. Furthermore, wiring delay or the like can be prevented by stacking circuits, so that high-speed operation can be performed.

<Stacked-Layer Structure>

FIG. 1 is a cross-sectional perspective view illustrating an imaging device of one embodiment of the present invention. The imaging device includes a layer 201, a layer 202, a layer 203, a layer 204, and a layer 205.

Although the description is made in which the imaging device is divided into the five layers for clarity of the description in this embodiment, the kind, number, and position of components included in each layer are not limited to those described in this embodiment. For example, a component, such as an insulating layer, a wiring, or a plug, which is positioned near the boundary between the layers is sometimes positioned in a layer different from the layer described in this embodiment. Furthermore, each layer may include a component that is different from the component described in this embodiment.

The layer 201 includes a region 210. A reading circuit of a pixel circuit, a driver circuit of a memory circuit, and the like can be provided in the region 210, for example.

The layer 202 includes a region 220. The memory circuit and the like can be provided in the region 220, for example.

The layer 203 includes a region 230. The pixel circuit (except a photoelectric conversion device 240), a driver circuit of the pixel circuit, and the like can be provided in the region 230, for example.

The layer 204 includes the photoelectric conversion device 240. As the photoelectric conversion device 240, a photodiode can be used, for example. Note that the photoelectric conversion device 240 can be referred to as a component of the pixel circuit.

The layer 205 includes an optical conversion layer 250. As the optical conversion layer 250, a color filter can be used, for example. The layer 205 can include a microlens array 255.

As described above, the imaging device of one embodiment of the present invention includes the photoelectric conversion device 240, the pixel circuit and the driver circuit of the pixel circuit provided in the region 230, the memory circuit provided in the region 220, the reading circuit of the pixel circuit and the driver circuit of the memory circuit provided in the region 210, and the like.

Here, the photoelectric conversion device 240 preferably has sensitivity to visible light. For example, a Si photodiode that uses silicon in a photoelectric conversion layer can be used as the photoelectric conversion device 240.

As components of the pixel circuit, the driver circuit of the pixel circuit, and the like, transistors each including a metal oxide in a channel formation region (hereinafter, OS transistors) are preferably used. The OS transistor has an extremely low off-state current and can suppress unnecessary data leakage from the pixel circuit. Therefore, the global shutter operation in which data are obtained in a plurality of pixel circuits at once and are sequentially read out can be realized with a simple circuit structure. In addition, the driver circuit of a pixel and the pixel circuit can be formed through common steps.

It is preferable to use an OS transistor also in the memory circuit. The use of the OS transistor as a cell transistor in the memory circuit can suppress unnecessary data leakage and decrease the frequency of refresh operation. Accordingly, power consumption can be reduced. Furthermore, a ferroelectric capacitor may be used in a memory cell included in the memory circuit. The data retained in a ferroelectric capacitor is non-volatile and thus refresh operation is not required; accordingly, power consumption can be reduced.

High-speed operation is required for the reading circuit of the pixel circuit, the driver circuit of the memory circuit, and the like; thus, transistors with a high mobility are preferably used in these circuits. For example, transistors each including silicon in a channel formation region (hereinafter, Si transistors) are preferably used. Examples of the Si transistor include a transistor including amorphous silicon and a transistor including crystalline silicon (microcrystalline silicon, low-temperature polysilicon, or single crystal silicon). Note that the driver circuit of the pixel circuit may be formed using a Si transistor.

In the case where a plurality of semiconductor devices are stacked, a polishing step and a bonding step are required to be performed a plurality of times. Consequently, there are issues such as a large number of manufacturing steps, the need for a dedicated apparatus, and a low yield, and the manufacturing cost is high. In one embodiment of the present invention, a circuit using an OS transistor is formed over a Si device (Si transistor, Si photodiode), whereby the number of polishing steps and the bonding steps can be reduced.

An OS transistor can be formed over a Si device with an insulating layer therebetween without using a complicated step such as bonding and bump bonding.

Figure 2A:
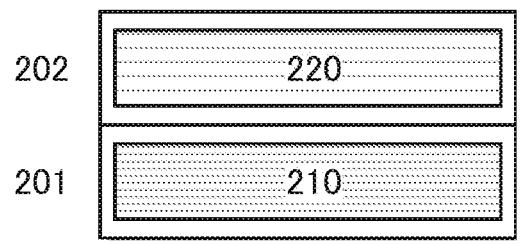
FIG. 2A to FIG. 2C are diagrams illustrating a method for manufacturing a stacked body.

Accordingly, in one embodiment of the present invention, the layer 201 is a layer including a silicon substrate, and a circuit including a Si transistor is formed in the region 210. Then, as illustrated in FIG. 2A, the layer 202 is formed over the layer 201. A circuit including an OS transistor is formed in the region 220 of the layer 202.

Figure 2B:
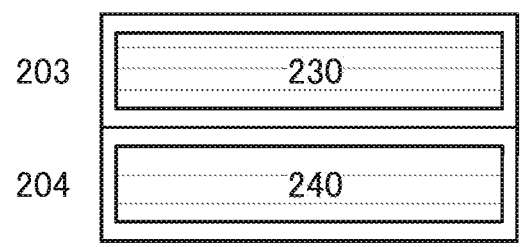

The layer 204 is a layer including a silicon substrate, and a Si photodiode is formed as the photoelectric conversion device 240 in the layer 204. Then, as illustrated in FIG. 2B, the layer 203 is formed over the layer 204. A circuit including an OS transistor is formed in the region 230 of the layer 203.

Figure 2C:
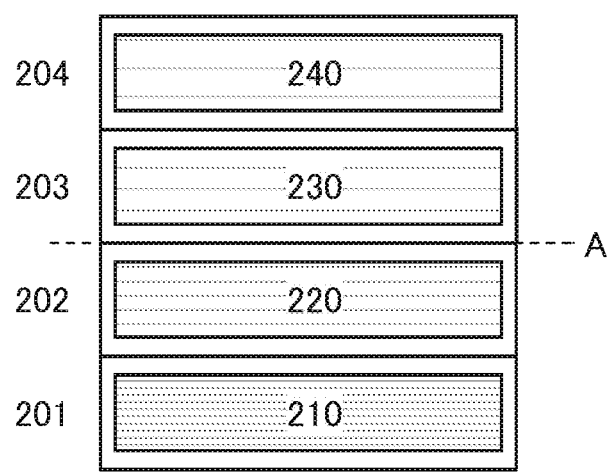

Then, as illustrated in FIG. 2C, the layer 202 and the layer 203 are attached to each other at a plane A, whereby a stacked-layer structure in which the layer 201 to the layer 204 overlap with one another can be manufactured. FIG. 1 illustrates a structure in which the layer 205 is further provided over the layer 204 of the stacked body in FIG. 2C.

In the case where Si devices are stacked, a polishing step and a bonding step are each required to be performed at least about three times in stacking four layers. However, in one embodiment of the present invention, one or two polishing steps and one bonding step are needed.

<Circuit>

Figure 3A:
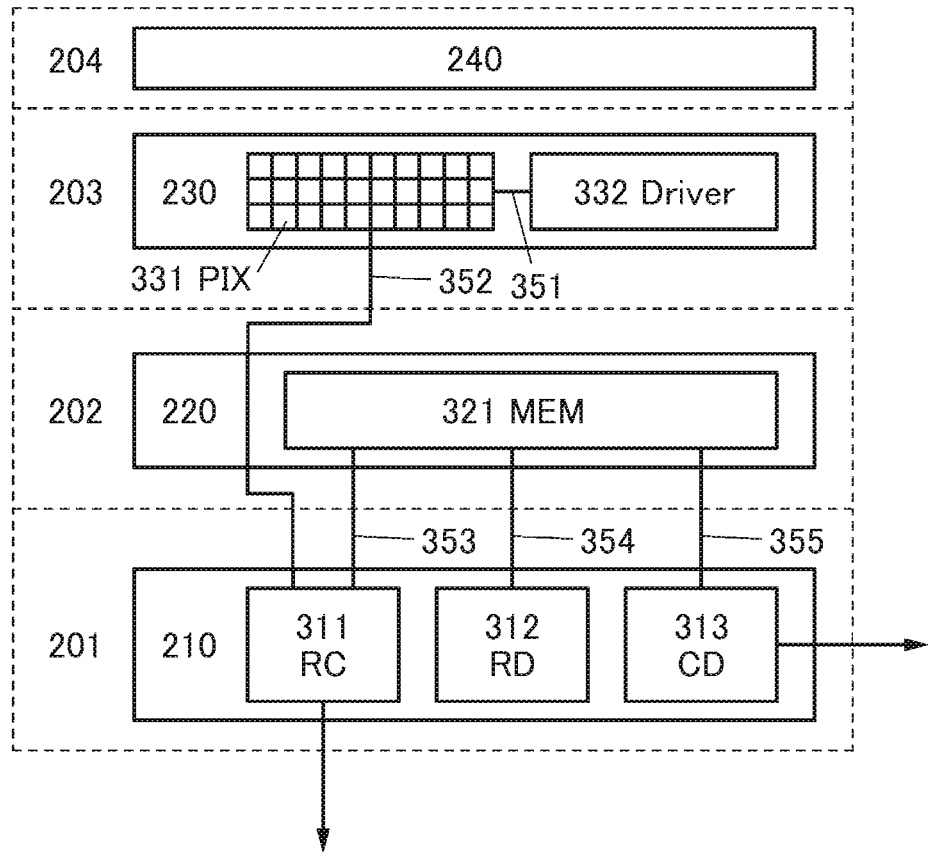
FIG. 3A and FIG. 3B are block diagrams illustrating an imaging device.

FIG. 3A is a simple block diagram illustrating electrical connection between components included in the layer 201 to the layer 204. Note that the photoelectric conversion device 240 included in the layer 204 is included in a pixel circuit 331 (PIX) in terms of the circuit structure and thus the electrical connection is not illustrated here.

The pixel circuits 331 are provided in a matrix and are electrically connected to a driver circuit 332 (Driver) through a wiring 351. The driver circuit 332 can control data acquisition operation, selection operation, and the like of the pixel circuit 331. For the driver circuit 332, a shift register or the like can be used, for example.

Moreover, the pixel circuit 331 is electrically connected to a reading circuit 311 (RC) through a wiring 352. The reading circuit 311 includes a correlated double sampling circuit (CDS circuit) for reducing noise and an A/D converter for converting analog data into digital data. The reading circuit 311 is electrically connected to a memory circuit 321 (MEM) through a wiring 353. The memory circuit 321 can retain digital data output from the reading circuit 311. Alternatively, digital data can be output to the outside from the reading circuit 311.

The memory circuit 321 is electrically connected to a row driver 312 (RD) through a wiring 354. In addition, the memory circuit 321 is electrically connected to a column driver 313 (CD) through a wiring 355. The row driver 312 is a driver circuit of the memory circuit 321 and can control data writing and reading. The column driver 313 is a driver circuit of the memory circuit 321 and can control data reading.

Figure 3B:
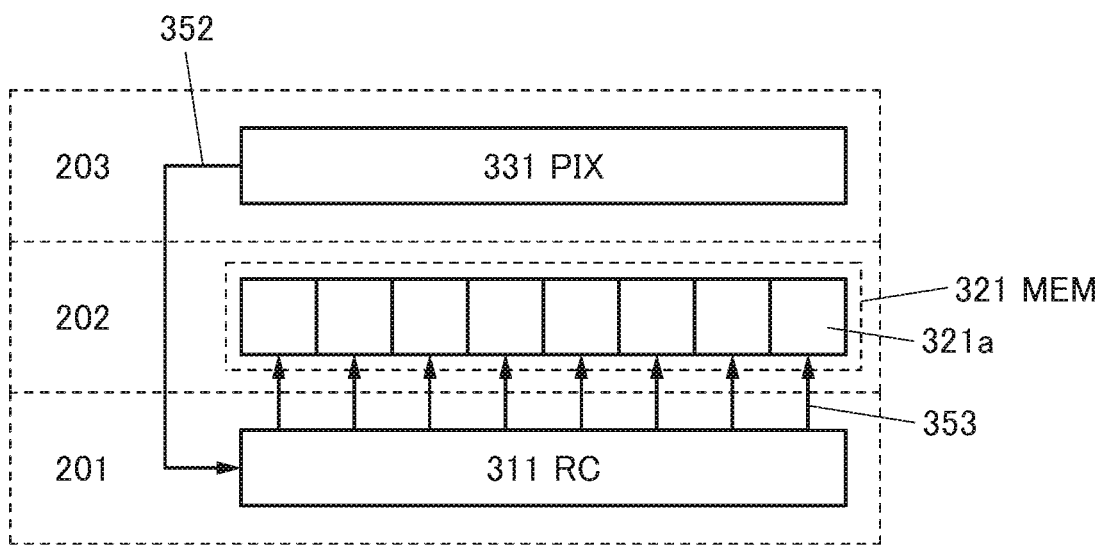

The details of the connection relation between the pixel circuit 331, the reading circuit 311, and the memory circuit 321 are described with reference to a block diagram of FIG. 3B. The number of reading circuits 311 can be equal to the number of the pixel circuits 331, and one reading circuit 311 is electrically connected to one pixel circuit 331 through the wiring 352. The reading circuit 311 is connected to the plurality of wirings 353, and each of the wirings 353 is electrically connected to one memory cell 321a. Note that a data retention circuit may be provided between the reading circuit 311 and the memory circuit 321.

The A/D converter included in the reading circuit 311 outputs binary data for a predetermined number of bits in parallel. Accordingly, the A/D converter is connected to the memory cells 321a for the predetermined number of bits. For example, when an output of the A/D converter is 8 bits, the A/D converter is connected to eight memory cells 321a.

In the imaging device of one embodiment of the present invention with the above structure, the A/D conversion of the analog data obtained in all of the pixel circuits 331 can be performed in parallel, and the converted digital data can be directly written to the memory circuit 321. In other words, operations from imaging to data storing in the memory circuit can be performed at high speed. In addition, the imaging operation, the A/D conversion operation, and the reading operation can be performed in parallel.

Figure 4:
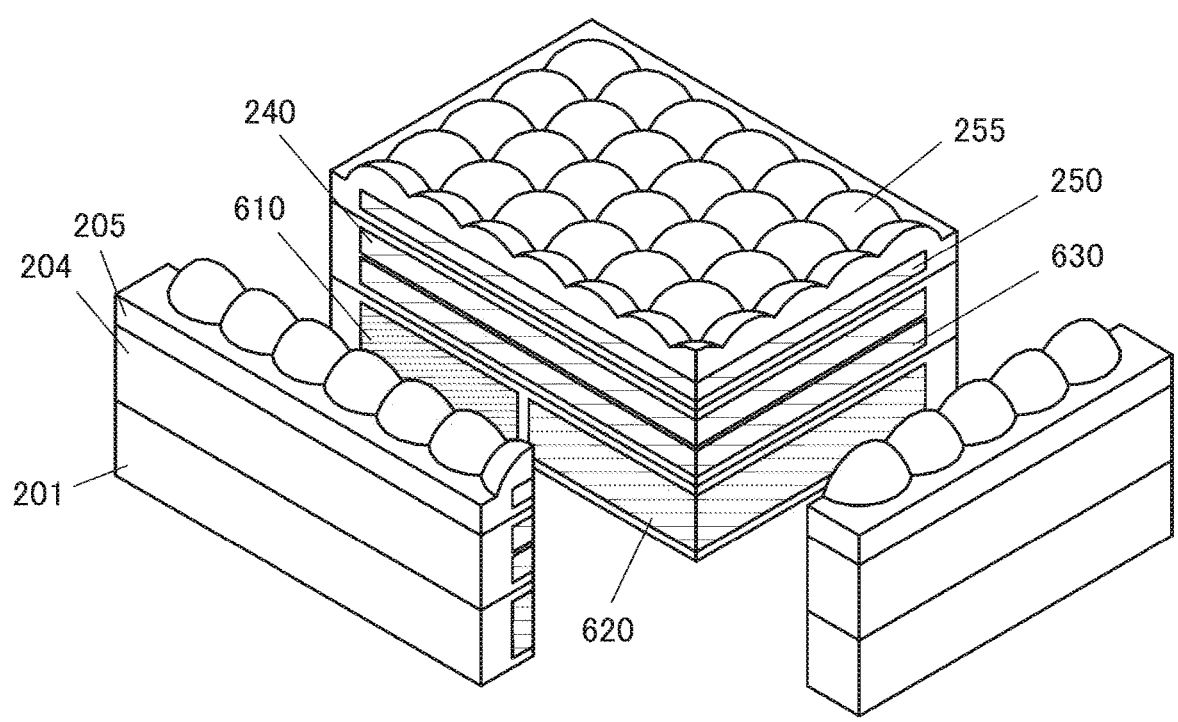
FIG. 4 is a cross-sectional perspective view illustrating an imaging device.

Although the imaging device has a structure in which the layer 202 and the layer 203 each including an OS transistor are provided in the above description, the imaging device may have a structure in which the layer 201, the layer 204, and the layer 205 are provided and the layer 202 and the layer 203 are not provided as illustrated in FIG. 4. Here, as in the description for FIG. 1, each of the layer 201 and the layer 204 is a layer including a silicon substrate.

Figure 5A:
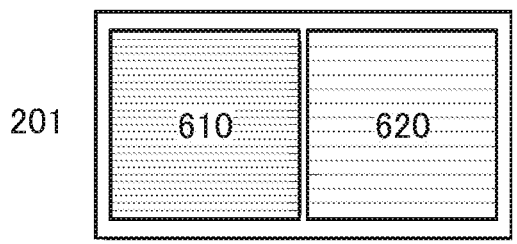
FIG. 5A to FIG. 5C are diagrams illustrating a method for manufacturing a stacked body.

As illustrated in FIG. 5A, a region 610 and a region 620 are provided in the layer 201. A circuit including a Si transistor is provided in each of the region 610 and the region 620.

Figure 5B:
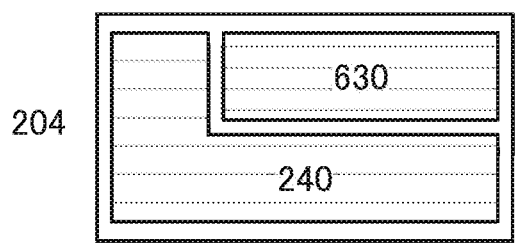

As illustrated in FIG. 5B, a region 630 and the photoelectric conversion device 240 are provided in the layer 204. A circuit including a Si transistor is provided in the region 630. A Si photodiode can be used as the photoelectric conversion device 240.

Figure 5C:
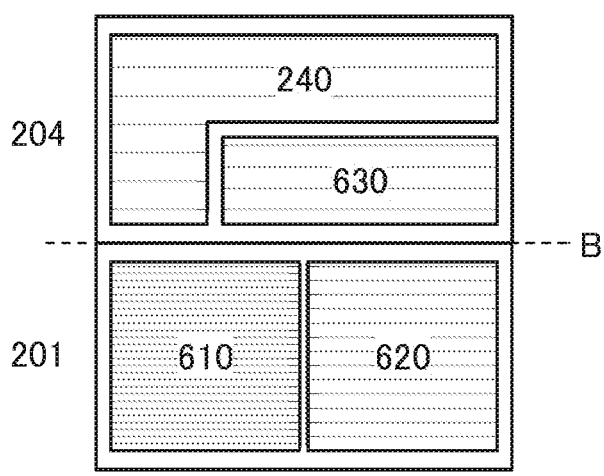

Then, as illustrated in FIG. 5C, the layer 201 and the layer 204 are attached to each other at a plane B, whereby a stacked-layer structure in which the layer 201 and the layer 204 overlap with each other can be manufactured. FIG. 4 illustrates a structure in which the layer 205 is further provided over the layer 204 of the stacked body in FIG. 5C.

Figure 6A:
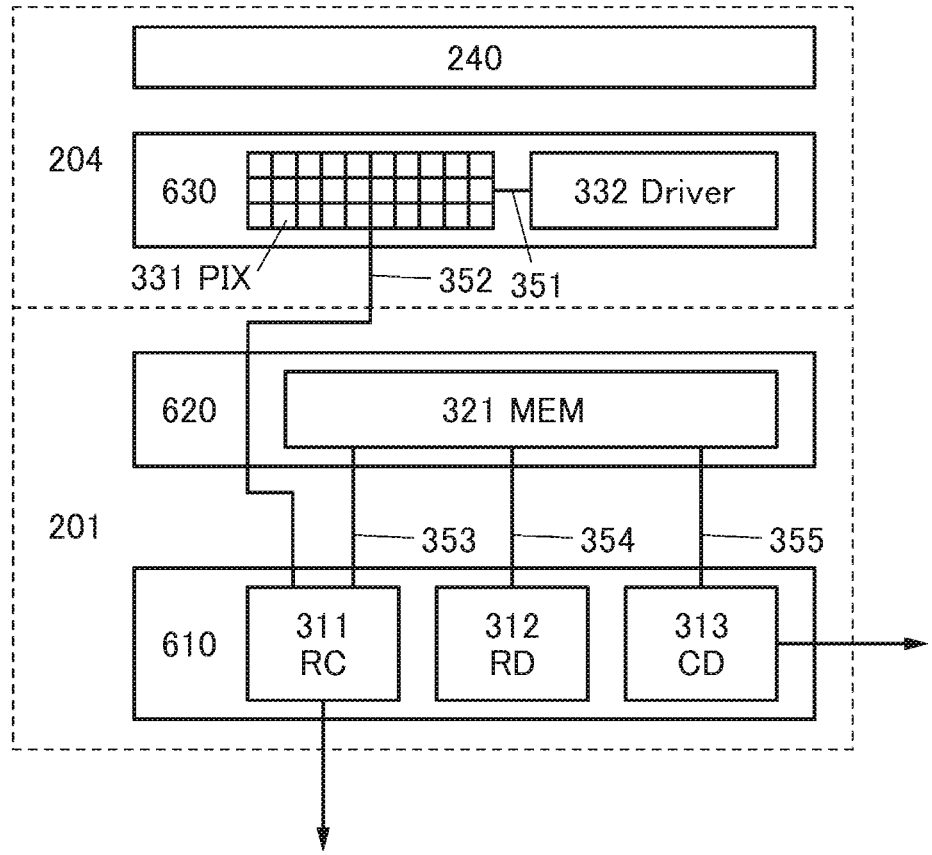
FIG. 6A and FIG. 6B are block diagrams illustrating an imaging device.
Figure 6B:
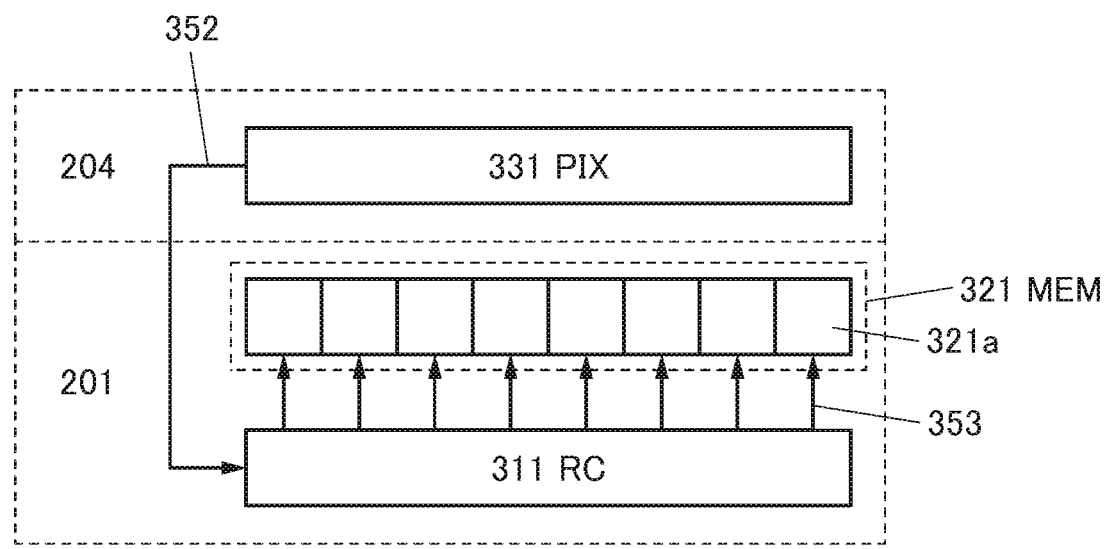

FIG. 6A and FIG. 6B are block diagrams of the circuits. The structure of the circuits is similar to that in FIG. 3A and FIG. 3B; the circuits provided in the region 210 illustrated in FIG. 3A are provided in the region 610. In addition, the circuits provided in the region 220 are provided in the region 620. Furthermore, the circuits provided in the region 230 are provided in the region 630.

In the structure illustrated in FIG. 4, the layer 202 and the layer 203 are not provided; thus, each of the circuits provided in the region 620 and the region 630 is formed using a Si transistor.

<Pixel Circuit>

Figure 7A:
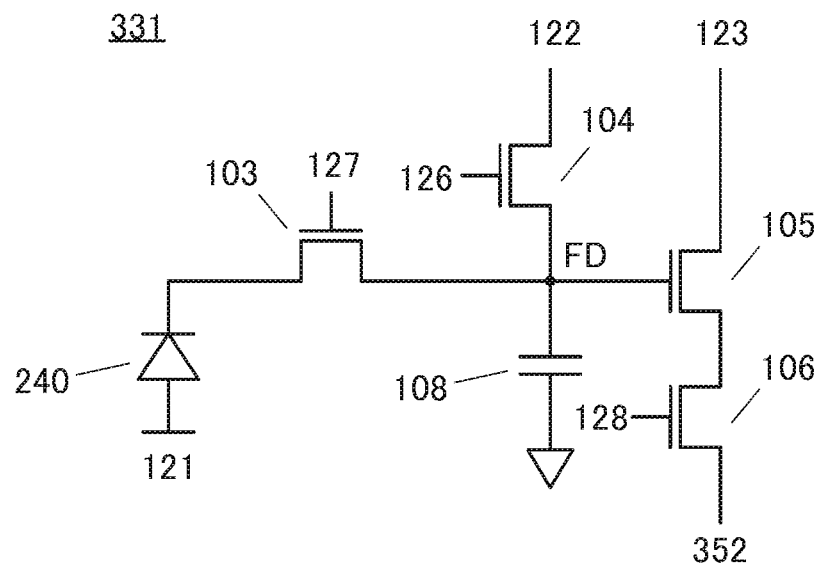
FIG. 7A and FIG. 7B are circuit diagrams each illustrating a pixel circuit.

FIG. 7A is a circuit diagram illustrating an example of the pixel circuit 331. The pixel circuit 331 can include the photoelectric conversion device 240, a transistor 103, a transistor 104, a transistor 105, a transistor 106, and a capacitor 108. Note that the capacitor 108 is not necessarily provided. In this specification, a structure in which the photoelectric conversion device 240 is removed from the above components is referred to as a "pixel circuit" in some cases.

One electrode (cathode) of the photoelectric conversion device 240 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. The one electrode of the capacitor 108 is electrically connected to a gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and the gate of the transistor 105 is a node FD. The node FD can function as a charge detection portion.

The other electrode (anode) of the photoelectric conversion device 240 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to the wiring 352.

The wirings 127, 126, and 128 can function as signal lines that control the conduction of the transistors. The wiring 352 can function as an output line.

The wirings 121, 122, and 123 can function as power supply lines. The structure illustrated in FIG. 7A is a structure in which the cathode side of the photoelectric conversion device 240 is electrically connected to the transistor 103 and the node FD is reset to a high potential in the operation; accordingly, the wiring 122 is set to a high potential (a potential higher than that of the wiring 121).

Figure 7B:
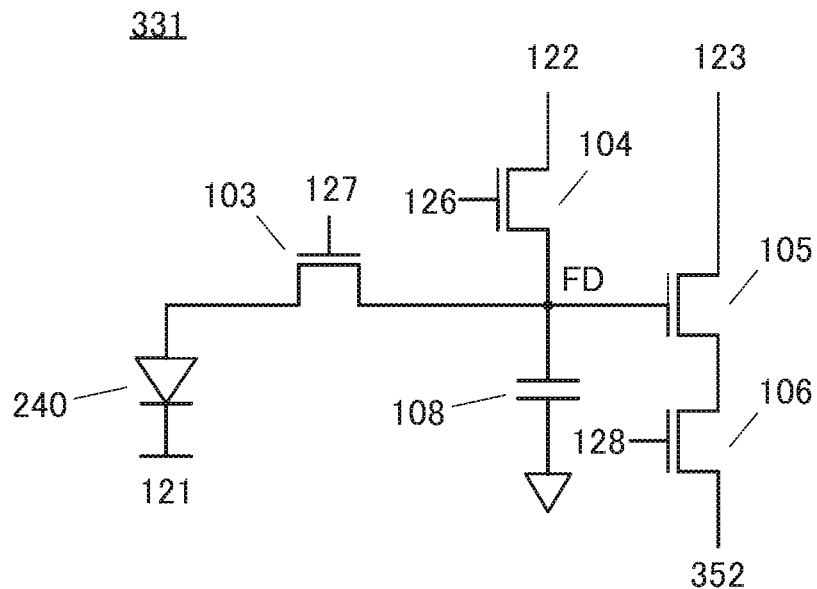

Although the cathode of the photoelectric conversion device 240 is electrically connected to the node FD in FIG. 7A, the anode side of the photoelectric conversion device 240 may be electrically connected to the one of the source and the drain of the transistor 103 as illustrated in FIG. 7B. Since the node FD is reset to a low potential in the operation in the structure, the wiring 122 is set to a low potential (a potential lower than that of the wiring 121).

The transistor 103 has a function of controlling the potential of the node FD. The transistor 104 has a function of resetting the potential of the node FD. The transistor 105 functions as a component of a source follower circuit and can output the potential of the node FD as image data to the wiring 352. The transistor 106 has a function of selecting a pixel to which the image data is output.

OS transistors are preferably used as the transistor 103 to the transistor 106 included in the pixel circuit 331. The OS transistor has a feature of an extremely low off-state current. In particular, when transistors with a low off-state current are used as the transistors 103 and 104, charge can be retained at the node FD for an extremely long period. Therefore, a global shutter mode in which a charge accumulation operation is performed in all the pixels at the same time can be used without complicating the circuit structure and operation method.

<Operation Method of Imaging Device>

FIG. 8A is a schematic view of an operation method with a rolling shutter mode, and FIG. 8B is a schematic view of the global shutter mode. Note that En denotes exposure (accumulation operation) of pixels in the n-th column (n is a natural number), and Rn denotes reading operation of pixels in the n-th column. In FIG. 8A and FIG. 8B, operations of pixels from the first row (Line [1]) to the M-th row (Line [M], M is a natural number) are shown.

The rolling shutter mode is an operation method in which exposure and data reading are performed sequentially and a reading period of a row overlaps with an exposure period of another row. The reading operation is performed right after the exposure, so that images can be taken even with a circuit structure having a relatively short data retention period. However, an image of one frame is composed of data that does not have simultaneity of imaging; therefore, distortion is caused in an image when imaging of a moving object is performed.

On the other hand, the global shutter mode is an operation method in which exposure is performed on all the pixels at the same time, data is retained in each pixel, and data reading is performed row by row. Thus, an undistorted image can be obtained even when imaging of a moving object is performed.

In the case where a transistor with a relatively high off-state current, such as a Si transistor, is used in a pixel circuit, charge easily leaks from a charge detection portion and thus the rolling shutter mode is used in many cases. In order to achieve the global shutter mode using a Si transistor, it is necessary to perform complicated operation at high speed, for example, to store data in a separate memory circuit. In contrast, when an OS transistor is used in a pixel circuit, the charge hardly leaks from the charge detection portion; thus, the global shutter mode can be easily achieved. Note that the imaging device of one embodiment of the present invention can also operate in the rolling shutter mode.

Note that the pixel circuit 331 may have a structure in which an OS transistor and a Si transistor are combined freely. Alternatively, all the transistors may be Si transistors.
<Operation of Pixel Circuit>

Figure 9A:
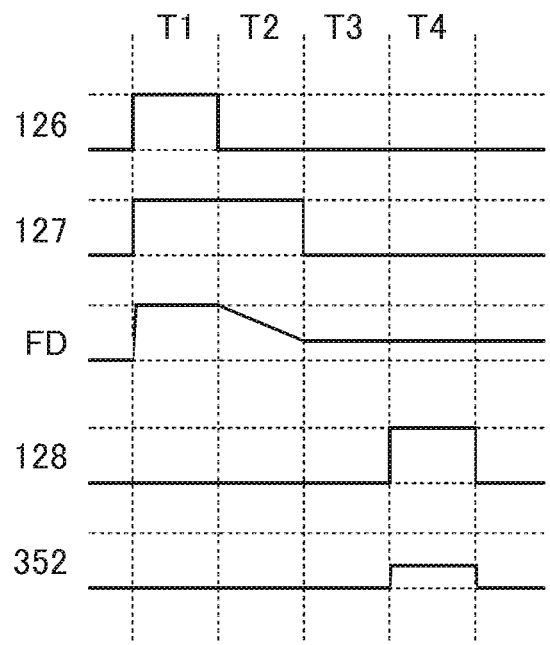
FIG. 9A and FIG. 9B are timing charts each showing an operation of a pixel circuit.

Next, an example of the operation of the pixel circuit 331 illustrated in FIG. 7A is described with reference to a timing chart of FIG. 9A. Note that in the description of the timing chart in this specification, a high potential is denoted by "H" and a low potential is denoted by "L". The wiring 121 is always supplied with "L", and the wirings 122 and 123 are always supplied with "H".

In a period T1, the potential of the wiring 126 is set to "H", the potential of the wiring 127 is set to "H", and the potential of the wiring 128 is set to "L", whereby the transistors 103 and 104 are turned on and the potential "H" of the wiring 122 is supplied to the node FD (reset operation).

In a period T2, the potential of the wiring 126 is set to "L", the potential of the wiring 127 is set to "H", and the potential of the wiring 128 is set to "L", whereby the transistor 104 is turned off and supply of the reset potential is stopped. Furthermore, the potential of the node FD is decreased in accordance with the operation of the photoelectric conversion device 240 (accumulation operation).

In a period T3, the potential of the wiring 126 is set to "L", the potential of the wiring 127 is set to "L", and the potential of the wiring 128 is set to "L", whereby the transistor 103 is turned off and the potential of the node FD is fixed and retained (retention operation). At this time, OS transistors with a low off-state current are used as the transistor 103 and the transistor 104, which are connected to the node FD, whereby unnecessary charge leakage from the node FD can be suppressed and the data retention time can be extended.

In a period T4, the potential of the wiring 126 is set to "L", the potential of the wiring 127 is set to "L", and the potential of the wiring 128 is set to "H", whereby the transistor 106 is turned on and the potential of the node FD is read out to the wiring 352 by source follower operation of the transistor 105 (reading operation).

The above is an example of the operation of the pixel circuit 331 illustrated in FIG. 7A.

Figure 9B:
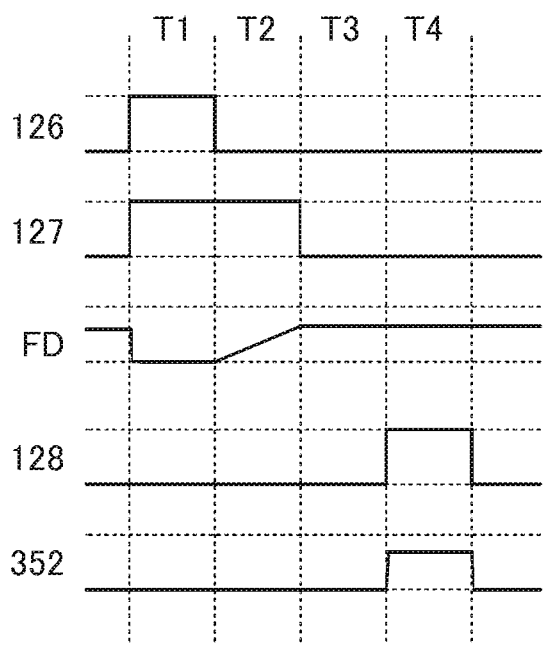

The pixel circuit 331 illustrated in FIG. 7B can operate in accordance with a timing chart of FIG. 9B. The wirings 121 and 123 are always supplied with "H", and the wiring 122 is always supplied with "L". The basic operation is similar to that described above with the timing chart of FIG. 9A.

Figure 10A:
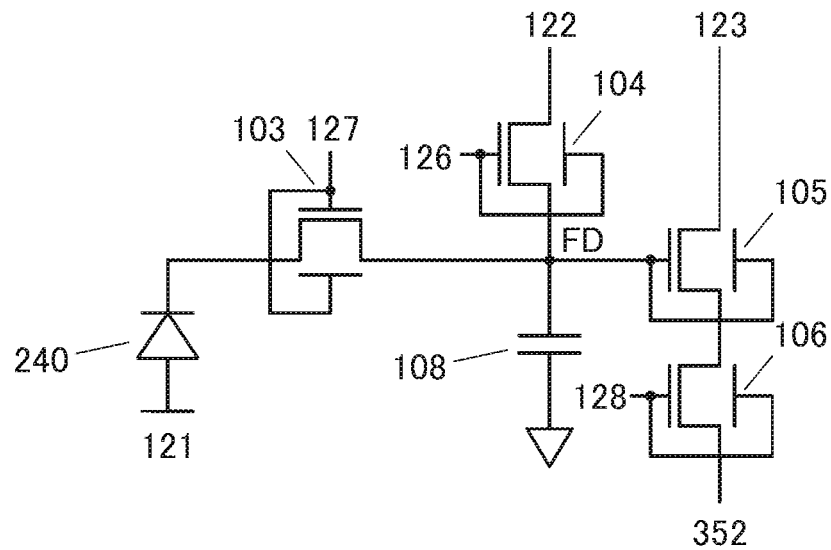
FIG. 10A and FIG. 10B are circuit diagrams each illustrating a pixel circuit.
Figure 10B:
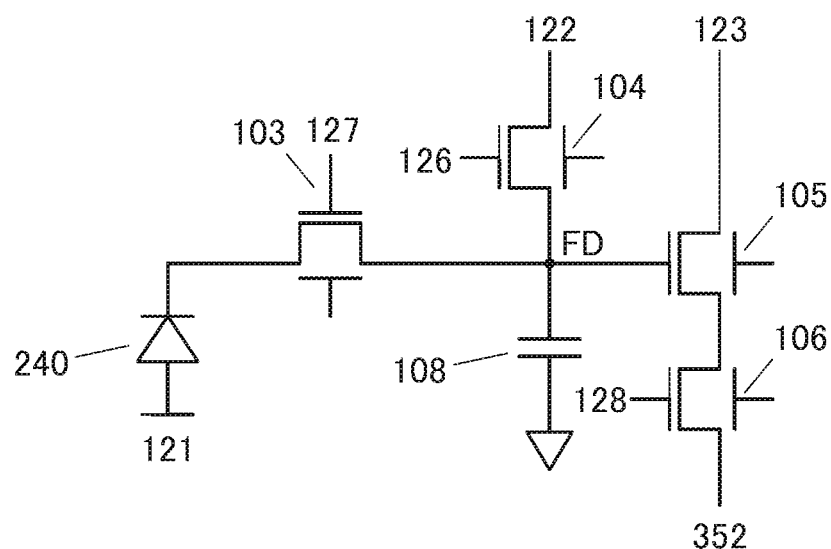

In one embodiment of the present invention, as illustrated in examples of FIG. 10A and FIG. 10B, a structure in which transistors are provided with back gates may be employed. FIG. illustrates a structure in which the back gates are electrically connected to front gates, which has an effect of increasing on-state current. FIG. 10B illustrates a structure in which the back gates are electrically connected to wirings capable of supplying a constant potential, which enables the threshold voltage of the transistors to be controlled.

Alternatively, a structure in which transistors can operate properly may be employed by combining the structures of the transistors illustrated in FIG. 10A and FIG. 10B, for example. Furthermore, the pixel circuit 331 may include a transistor without a back gate.
<Reading Circuit>

Figure 11:
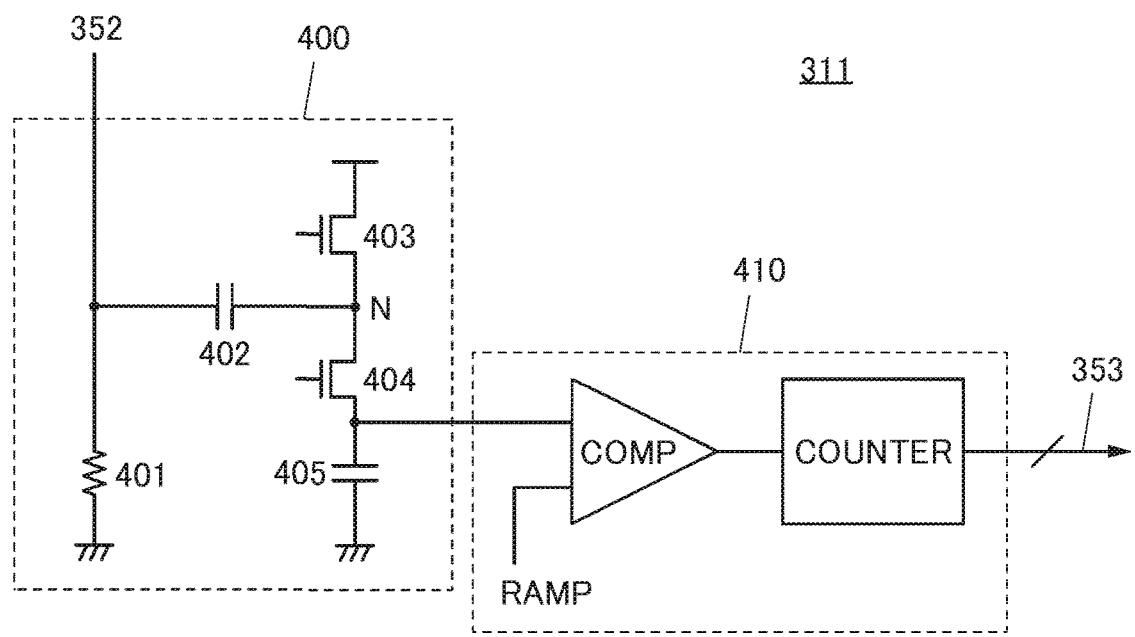
FIG. 11 is a circuit diagram and a block diagram illustrating a reading circuit.

FIG. 11 illustrates an example of the reading circuit 311 connected to the pixel circuit 331, and shows a circuit diagram of a CDS circuit 400 and a block diagram of an A/D converter 410 that is electrically connected to the CDS circuit 400. Note that the CDS circuit and the A/D converter illustrated in FIG. 11 are examples, and may each have another structure.

The CDS circuit 400 can include a resistor 401 for voltage conversion, a capacitor 402 for capacitive coupling, a transistor 403 for supplying a potential $V^0$, a transistor 404 for holding a potential supplied to the A/D converter 410, and a capacitor 405 for holding a potential. An input of the CDS circuit 400 is electrically connected to the pixel circuit 331, and an output of the CDS circuit 400 is electrically connected to a comparator circuit (COMP) of the A/D converter 410.

When the potential of the wiring 352 is $V_{res}$ (the pixel circuit 331 is in a reset state), the potential of a node N (a connection point of the transistors 403 and 404 and the capacitor 402) is set to $V_0$. Then, the node N is brought into a floating state and the potential of the wiring 352 becomes $V_{data}$ (the pixel circuit 331 outputs image data); accordingly, the potential of the node N becomes $V_0+V_{data}-V_{res}$. Therefore, in the CDS circuit 400, the potential in the reset state can be subtracted from the potential of the imaging data output from the pixel circuit 331, so that the noise component can be reduced.

The A/D converter 410 can include the comparator circuit (COMP) and a counter circuit (COUNTER). In the A/D converter 410, a signal potential input from the CDS circuit 400 to the comparator circuit (COMP) and a swept reference potential (RAMP) are compared. Then, the counter circuit (COUNTER) operates in accordance with the output of the comparator circuit (COMP), and a digital signal is output to a plurality of wirings 353.
<Memory Circuit 1>

Figure 12A:
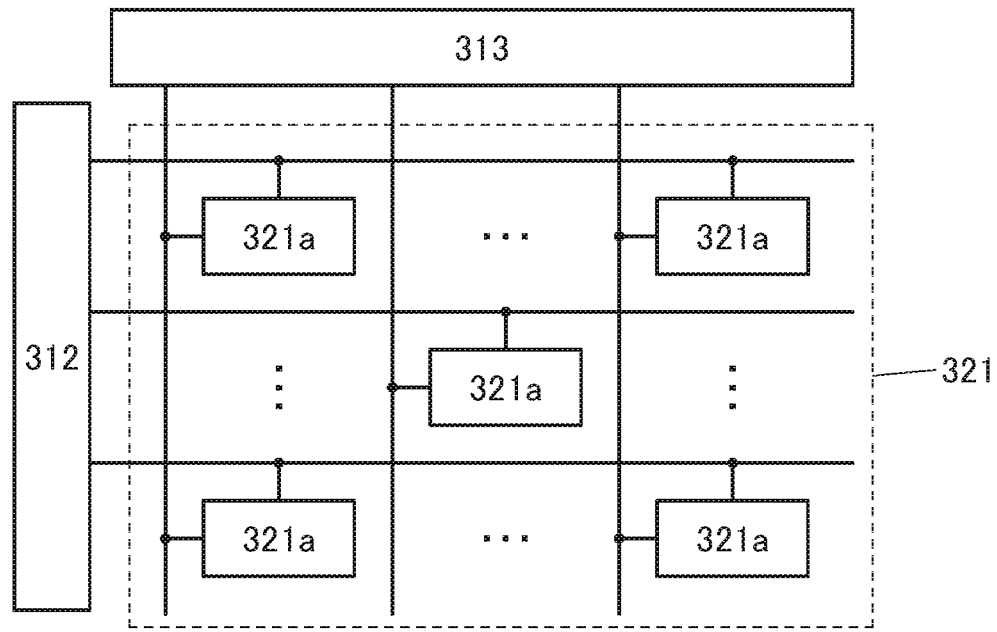
FIG. 12A is a diagram illustrating a memory circuit.

FIG. 12A illustrates the connection relation between the memory cell 321a included in the memory circuit 321, the row driver 312, and the column driver 313. A plurality of memory cells 321a are provided in the region 220 or the region 620 as the memory circuit 321. The row driver 312 and the column driver 313 are driver circuits for the memory cells 321a and can be provided in the region 210 or the region 610. Note that a sense amplifier or the like may be used for data reading.

Figure 12B:
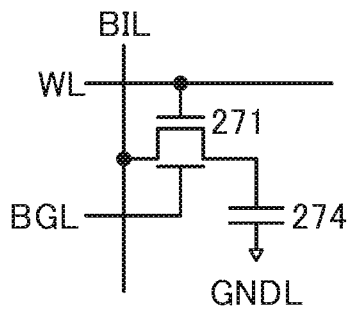
FIG. 12B to FIG. 12D are diagrams each illustrating a memory cell.
Figure 12C:
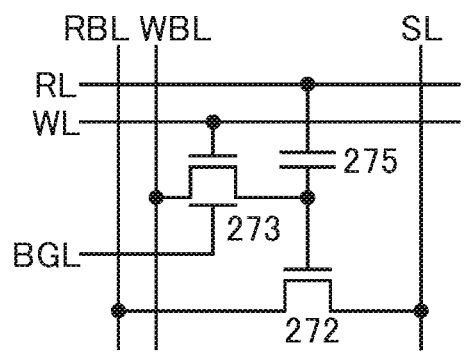
Figure 12D:
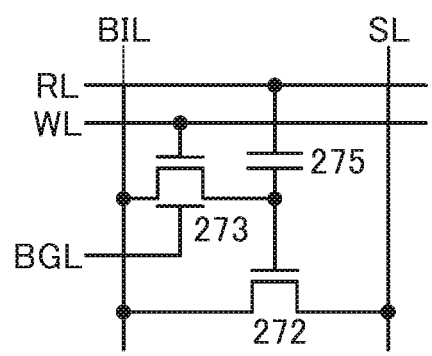

The memory circuit 321 includes m×n memory cells 321a in total; m memory cells (m is an integer greater than or equal to 1) in a column and n memory cells (n is an integer greater than or equal to 1) in a row, and the memory cells 321a are arranged in a matrix. FIG. 12B to FIG. 12D illustrate a memory cell 321b to a memory cell 321d that can be used as the memory cell 321a. Note that in the following description, a bit line and the like can be connected to the column driver 313. A word line and the like can be connected to the row driver 312.

For the row driver 312 and the column driver 313, a decoder or a shift register can be used, for example. Note that a plurality of row drivers 312 and a plurality of column drivers 313 may be provided.

FIG. 12B illustrates a circuit structure example of the memory cell 321b of a DRAM type. The memory cell 321b includes a transistor 271 and a capacitor 274.

One of a source and a drain of the transistor 271 is connected to one electrode of the capacitor 274, the other of the source and the drain of the transistor 271 is connected to a wiring BIL, a gate of the transistor 271 is connected to a wiring WL, and a back gate of the transistor 271 is connected to a wiring BGL. The other electrode of the capacitor 274 is connected to a wiring GNDL. The wiring GNDL is a wiring for supplying a low-level potential (reference potential).

The wiring BIL functions as a bit line. The wiring WL functions as a word line. The wiring BGL functions as a wiring for applying a potential to the back gate of the transistor 271. By applying an appropriate potential to the wiring BGL, the threshold voltage of the transistor 271 can be increased or decreased. Alternatively, the wiring BGL may be electrically connected to the wiring WL. By applying the same potential as the wiring WL to the wiring BGL, current characteristics of the transistor 271 can be enhanced.

Data writing and reading are performed in such a manner that a high-level potential is applied to the wiring WL to turn on the transistor 271 so that the wiring BIL is electrically connected to the one electrode of the capacitor 274. For example, a sense amplifier is electrically connected to the wiring BIL, whereby the potential of the wiring BIL can be amplified by the sense amplifier and read out.

An OS transistor or a Si transistor can be used as the transistor 271. In this specification and the like, a DRAM using an OS transistor is referred to as a DOSRAM (Dynamic Oxide Semiconductor Random Access Memory).

The OS transistor using the oxide semiconductor including indium, gallium, and zinc has a feature of an extremely low off-state current. The use of the OS transistor as the transistor 271 enables the leakage current of the transistor 271 to be extremely low. That is, with the use of the transistor 271, written data can be retained for a long time, and thus the frequency of refresh of the memory cell can be reduced. Alternatively, refresh operation of the memory cell can be omitted.

FIG. 12C illustrates a circuit structure example of a memory cell 321c that is of a gain cell type including two transistors and one capacitor (also referred to as "2Tr1C-type"). The memory cell 321c includes a transistor 273, a transistor 272, and a capacitor 275.

One of a source and a drain of the transistor 273 is connected to one electrode of the capacitor 275, the other of the source and the drain of the transistor 273 is connected to a wiring WBL, a gate of the transistor 273 is connected to the wiring WL, and a back gate of the transistor 273 is connected to the wiring BGL. The other electrode of the capacitor 275 is connected to a wiring RL. One of a source and a drain of the transistor 272 is connected to a wiring RBL, the other of the source and the drain of the transistor 272 is connected to a wiring SL, a gate of the transistor 272 is connected to the one electrode of the capacitor 275.

The wiring WBL functions as a write bit line. The wiring RBL functions as a read bit line. The wiring WL functions as a word line. The wiring RL functions as a wiring for applying a predetermined potential to the other electrode of the capacitor 275. The reference potential is preferably applied to the wiring RL at the time of data writing and during data retention.

The wiring BGL functions as a wiring for applying a potential to the back gate of the transistor 273. By applying an appropriate potential to the wiring BGL, the threshold voltage of the transistor 273 can be increased or decreased. Alternatively, the wiring BGL may be electrically connected to the wiring WL. By applying the same potential as the wiring WL to the wiring BGL, current characteristics of the transistor 273 can be enhanced.

Data writing is performed in such a manner that a high-level potential is applied to the wiring WL to turn on the transistor 273 so that the wiring WBL is electrically connected to the one electrode of the capacitor 275. Specifically, when the transistor 273 is in an on state, a potential corresponding to information to be stored is applied to the wiring WBL, whereby the potential is written to the one electrode of the capacitor 275 and the gate of the transistor 272. After that, a low-level potential is applied to the wiring WL to turn off the transistor 273, whereby the potential of the one electrode of the capacitor 275 and the potential of the gate of the transistor 272 are retained.

Data reading is performed by applying a predetermined potential to the wiring RL and the wiring SL. A current flowing between the source and the drain of the transistor 272 and the potential of the one of the source and the drain of the transistor 273 are determined by the potential of the gate of the transistor 272 and the potential of the other of the source and the drain of the transistor 273; thus, by reading out the potential of the wiring RBL connected to the one of the source and the drain of the transistor 272, the potential retained at the one electrode of the capacitor 275 (or the gate of the transistor 272) can be read out. In other words, information written to this memory cell can be read from the potential retained at the one electrode of the capacitor 275 (or the gate of the transistor 272). Alternatively, existence or absence of information written to this memory cell can be found.

Alternatively, as illustrated in FIG. 12D, the wiring WBL and the wiring RBL may be combined into one wiring BIL. In the memory cell 321d illustrated in FIG. 12D, one wiring BIL corresponds to the wiring WBL and the wiring RBL in the memory cell 321c, and the other of the source and the drain of the transistor 273 and the one of the source and the drain of the transistor 272 are connected to the wiring BIL. In other words, in the memory cell 321d, one wiring BIL operates as a write bit line and a read bit line.

Note that also in each of the memory cell 321c and the memory cell 321d, an OS transistor is preferably used as the transistor 273. A memory device using a 2Tr1C-type memory cell using an OS transistor as the transistor 273, such as the memory cell 321c and the memory cell 321d, is referred to as a NOSRAM (Non-volatile Oxide Semiconductor Random Access Memory). Note that the circuit structure of the memory cell can be changed as appropriate.

<Memory Circuit 2>

Figure 13A:
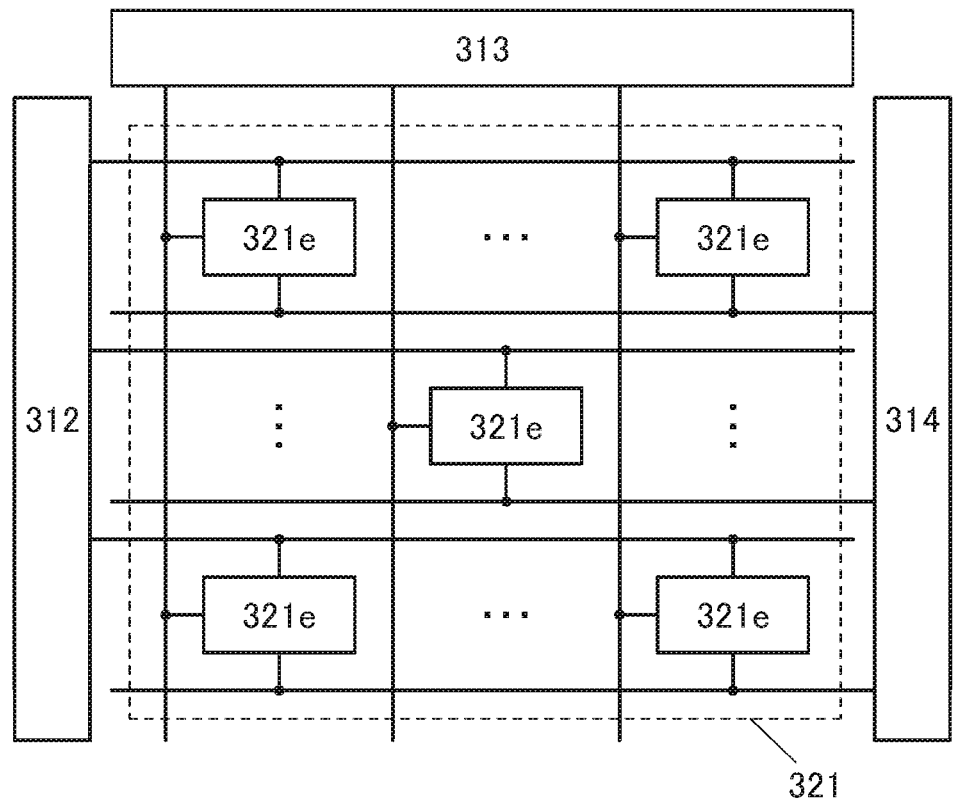
FIG. 13A is a diagram illustrating a memory circuit.

The memory circuit 321 may have a structure illustrated in FIG. 13A. A memory cell 321e illustrated in FIG. 13B can be used for the memory circuit 321 having the structure illustrated in FIG. 13A.

The memory cell 321e includes a transistor 276 and a capacitor 277. One of a source and a drain of the transistor 276 is connected to one electrode of the capacitor 277, the other of the source and the drain of the transistor 276 is connected to the wiring BIL, and a gate of the transistor 276 is connected to the wiring WL. The other electrode of the capacitor 277 is connected to a wiring PL.

The wiring BIL functions as a bit line. The wiring WL functions as a word line. The wiring PL is a wiring for supplying a plate potential required for data writing or reading to the capacitor 277. A circuit 314 illustrated in FIG. 13A is a circuit for supplying the plate potential and can be provided in the region 210 or the region 610 like the row driver 312 and the column driver 313. A sense amplifier may be electrically connected to the wiring BIL. The potential of the wiring BIL can be amplified by the sense amplifier and read out.

An OS transistor, a Si transistor, or the like can be used as the transistor 276. In the case where an OS transistor is used as the transistor 276, a back gate electrically connected to the wiring BGL is preferably provided as illustrated in FIG. 13C. By applying an appropriate potential to the wiring BGL, the threshold voltage of the transistor 271 can be increased or decreased. Alternatively, the wiring BGL may be electrically connected to the wiring WL. By applying the same potential as the wiring WL to the wiring BGL, current characteristics of the transistor 271 can be enhanced.

An OS transistor has a feature of high withstand voltage. Thus, the transistor 276 is an OS transistor, whereby high voltage can be applied to the transistor 276 even when the transistor 276 is miniaturized. The miniaturization of the transistor 276 can reduce the area occupied by the memory cell 321e.

The capacitor 277 includes a material that can have ferroelectricity as a dielectric layer between the two electrodes. The dielectric layer included in the capacitor 277 is referred to as a ferroelectric layer in the following description. A capacitor including the ferroelectric layer can be referred to as a ferroelectric capacitor. A structure in which the ferroelectric capacitor and a switch such as a transistor are combined can be referred to as a ferroelectric memory. As examples of the material that can have ferroelectricity, hafnium oxide, zirconium oxide, HfZrO$_X$ (X is a real number greater than 0), a material obtained by adding an element J1 (the element J1 here is zirconium (Zr), silicon (Si), aluminum (Al), gadolinium (Gd), yttrium (Y), lanthanum (La), or strontium (Sr), for example) to hafnium oxide, and a material obtained by adding an element J2 (the element J2 here is hafnium (Hf), silicon (Si), aluminum (Al), gadolinium (Gd), yttrium (Y), lanthanum (La), or strontium (Sr), for example) to zirconium oxide can be given. As the material that can have ferroelectricity, a piezoelectric ceramic having a perovskite structure, such as lead titanate (PT), barium strontium titanate (BST), strontium titanate, lead zirconate titanate (PZT), strontium bismuth tantalate (SBT), bismuth ferrite (BFO), or barium titanate may be used. As the material that can have ferroelectricity, a mixture or compound containing a plurality of materials selected from the above-described materials can be used, for example. Alternatively, the ferroelectric layer can have a stacked-layer structure of a plurality of materials selected from the above-described materials.

Especially, as the material that can have ferroelectricity, hafnium oxide or a material containing hafnium oxide and zirconium oxide are able to have ferroelectricity even when processed into a several-nanometer-thick thin film. When the ferroelectric layer can be thinned, compatibility with the miniaturization of transistors can be improved.

In the case where HfZrO$_X$ is used as the material that can have ferroelectricity, an ALD (Atomic Layer Deposition) method, especially a thermal ALD method is preferably used for the deposition. Furthermore, in the case where the material that can have ferroelectricity is deposited by a thermal ALD method, a material that does not contain a hydrocarbon (also referred to as Hydro Carbon or HC) is suitably used as a precursor. In the case where one or both of hydrogen and carbon are contained in the material that can have ferroelectricity, crystallization of the material that can have ferroelectricity might be inhibited. Thus, using a precursor that does not contain a hydrocarbon in the above-described manner is preferable in order to reduce the concentration of one or both of hydrogen and carbon in the material that can have ferroelectricity. For example, as the precursor that does not contain a hydrocarbon, a chlorine-based material can be given. Note that in the case where a material containing hafnium oxide and zirconium oxide (HfZrO$_x$) is used as the material that can have ferroelectricity, HfCl$_4$ and/or ZrCl$_4$ is preferably used as the precursor.

When a film using the material that can have ferroelectricity is deposited, a highly purified intrinsic film having ferroelectricity can be formed by thoroughly removing impurities, which are at least one or more of hydrogen, a hydrocarbon, and carbon here, from the film. Note that the highly purified intrinsic film having ferroelectricity and a highly purified intrinsic oxide semiconductor described in a later embodiment are highly compatible with each other in the manufacturing process. Thus, a method for manufacturing a semiconductor device with high productivity can be provided.

In the case where HfZrO$_X$ is used as the material that can have ferroelectricity, it is preferable that hafnium oxide and zirconium oxide be deposited alternately by a thermal ALD method so as to achieve a composition ratio of hafnium oxide to zirconium oxide of 1:1.

In the case where the material that can have ferroelectricity is deposited by a thermal ALD method, H$_2$O or O$_3$ can be used as an oxidizer. However, the oxidizer in the thermal ALD method is not limited thereto. For example, the oxidizer in the thermal ALD method may contain any one or more selected from O$_2$, O$_3$, N$_2$O, NO$_2$, H$_2$O, and H$_2$O$_2$.

Note that the crystal structure of the material that can have ferroelectricity is not particularly limited. For example, the material that can have ferroelectricity may have any one or more selected from cubic, tetragonal, orthorhombic, and monoclinic crystal structures. The material that can have ferroelectricity especially preferably has an orthorhombic crystal structure to exhibit ferroelectricity. Alternatively, the material that can have ferroelectricity may have a composite structure of an amorphous structure and a crystal structure.

Figure 14A:
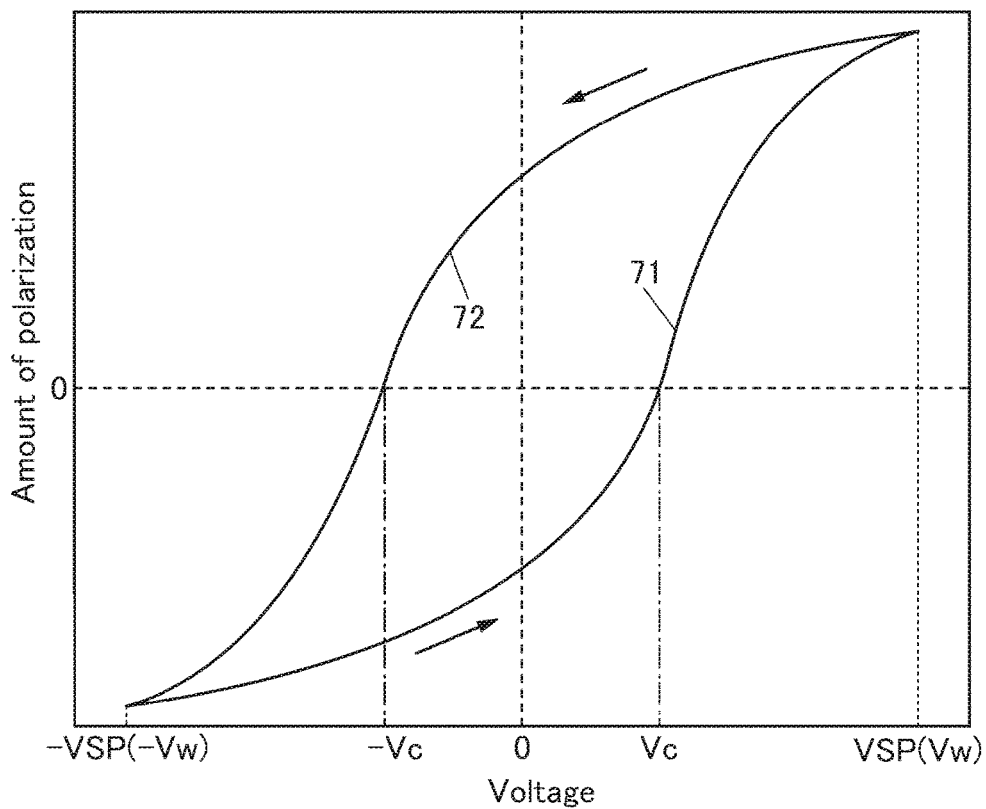
FIG. 14A is a diagram showing hysteresis characteristics of a ferroelectric layer.

FIG. 14A is a graph showing an example of hysteresis characteristics of a ferroelectric layer. The horizontal axis in FIG. 14A represents voltage applied to the ferroelectric layer. The voltage can be a difference between the potential of one electrode of the capacitor 277 and the potential of the other electrode of the capacitor 277, for example. The vertical axis in FIG. 14A represents the amount of polarization of the ferroelectric layer.

As shown in FIG. 14A, the hysteresis characteristics of the ferroelectric layer can be represented by a curve 71 and a curve 72. Voltages at intersection points of the curve 71 and the curve 72 are referred to as VSP and −VSP. VSP and −VSP have different polarities.

After a voltage lower than or equal to −VSP is applied to the ferroelectric layer, the voltage applied to the ferroelectric layer is increased, so that the amount of polarization of the ferroelectric layer is increased according to the curve 71. In contrast, after a voltage higher than or equal to VSP is applied to the ferroelectric layer, the voltage applied to the ferroelectric layer is reduced, so that the amount of polarization of the ferroelectric layer is decreased according to the curve 72. Here, VSP and −VSP can be referred to as saturated polarization voltages. For example, VSP and −VSP may be called a first saturated polarization voltage and a second saturated polarization voltage, respectively. Although the absolute value of the first saturated polarization voltage and the absolute value of the second saturated polarization voltage are equal to each other in FIG. 14A, they may be different from each other.

Here, in the case where the amount of polarization of the ferroelectric layer is varied according to the curve 71, the voltage at the time when the amount of polarization of the ferroelectric layer is 0 (coercive voltage) is referred to as Vc. When the amount of polarization of the ferroelectric layer is varied according to the curve 72, the voltage at the time when the amount of polarization of the ferroelectric layer is 0 (coercive voltage) is referred to as −Vc. The value of Vc and the value of −Vc can be values between −VSP and VSP. Note that Vc and −Vc may be called a first coercive voltage and a second coercive voltage, respectively. Although FIG. 14A illustrates an example in which the absolute value of the first coercive voltage and the absolute value of the second coercive voltage are equal to each other, they may be different from each other.

As described above, the voltage applied to the ferroelectric layer included in the capacitor 277 can be represented by the difference between the potential of the one electrode of the capacitor 277 and the potential of the other electrode of the capacitor 277. The other electrode of the capacitor 277 is electrically connected to the wiring PL. Thus, it is possible to control the voltage applied to the ferroelectric layer included in the capacitor 277 by controlling the potential of the wiring PL.

<Example of Method for Driving Memory Cell>

An example of a method for driving the memory cell 321e illustrated in FIG. 13B will be described below. In the following description, the voltage applied to the ferroelectric layer of the capacitor 277 is a difference between the potential of one electrode of the capacitor 277 and the potential of the other electrode of the capacitor 277 (the wiring PL). The transistor 276 is an n-channel transistor.

Figure 13B:
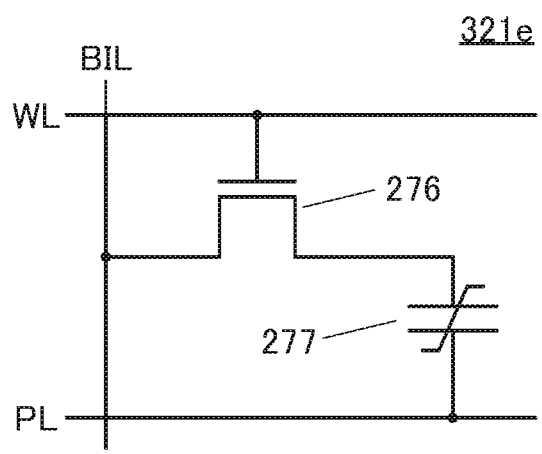
FIG. 13B and FIG. 13C are diagrams each illustrating a memory cell.
Figure 13C:
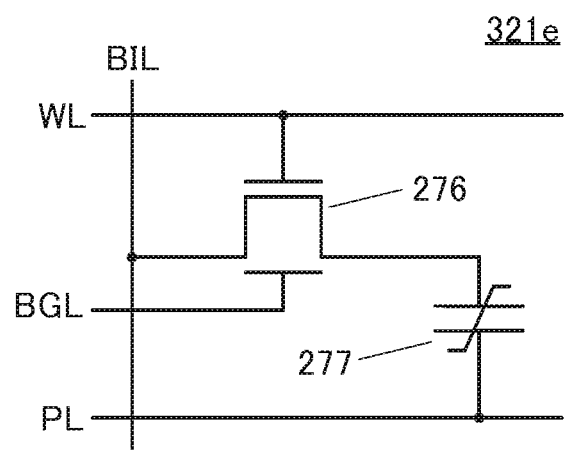
Figure 14B:
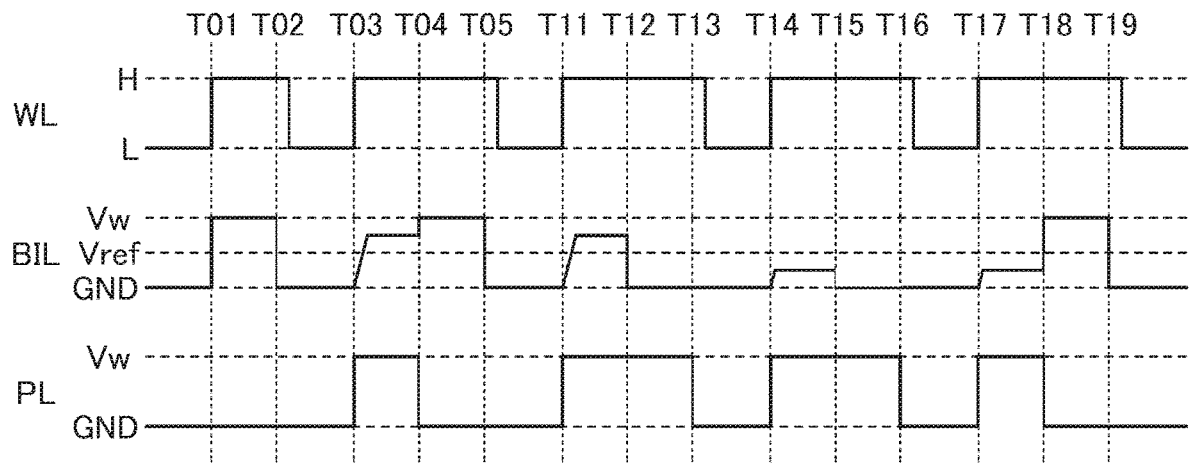
FIG. 14B is a timing chart showing an operation of a memory cell.

FIG. 14B is a timing chart showing an example of a method for driving the memory cell 321e in FIG. 13B. In the example shown in FIG. 14B, binary digital data is written to and read from the memory cell 321e.

The sense amplifier electrically connected to the wiring BIL is supplied with Vref as a reference potential. For example, when the potential of the wiring BIL is higher than Vref, data "1" can be read out. When the potential of the wiring BIL is lower than Vref, data "0" can be read out.

First, the operation of writing data "1" to the memory cell 321e in a period from Time T01 to Time T03 is described.

In a period from Time T01 to Time T02, the potential of the wiring WL is set to a high potential H, whereby the transistor 276 is turned on. In addition, the potential of the wiring BIL is set to Vw. Since the transistor 276 is in an on state, the potential of the one electrode of the capacitor 277 becomes Vw. Furthermore, the potential of the wiring PL is set to GND. Through this operation, the voltage applied to the ferroelectric layer of the capacitor 277 becomes "Vw-GND". Accordingly, data "1" can be written to the memory cell 321e.

Here, Vw is preferably VSP or higher; for example, Vw can be equal to VSP. GND can be set to a ground potential or 0 V, for example, but may be another potential. Next, at Time T02, the potential of the wiring BIL and the potential of the wiring PL are each set to GND; accordingly, the voltage applied to the ferroelectric layer of the capacitor 277 becomes 0 V. When the voltage "Vw-GND" applied to the ferroelectric layer of the capacitor 277 is higher than or equal to VSP in the period from Time T01 to Time T02, the amount of polarization of the ferroelectric layer of the capacitor 277 is varied according to the curve 72 shown in FIG. 14A until it reaches the position of 0 V in a period from Time T02 to Time T03. Thus, the direction of polarization is maintained in the ferroelectric layer of the capacitor 277.

After the potential of the wiring BIL and the potential of the wiring PL are set to GND, the potential of the wiring WL is set to a low potential L, whereby the transistor 276 is turned off. Thus, the writing operation is completed, and the data "1" is retained in the memory cell 321e.

Next, the data reading operation in a period from Time T03 to Time T04 is described.

In the period from Time T03 to Time T04, the potential of the wiring WL is set to a high potential H, whereby the transistor 276 is turned on. In addition, the potential of the wiring PL is set to Vw. With the potential of the wiring PL set to Vw, the voltage applied to the ferroelectric layer of the capacitor 277 becomes "GND-Vw".

At this time, the voltage applied to the ferroelectric layer of the capacitor 277 is inverted from "Vw-GND" into "GND-Vw"; accordingly, polarization inversion occurs in the ferroelectric layer of the capacitor 277. Since current flows through the wiring BIL at the time of the polarization inversion, the potential of the wiring BIL becomes higher than Vref. Thus, the data "1" retained in the memory cell 321e can be read out by operation of the sense amplifier. Note that although an example in which Vref is higher than GND and lower than Vw is described, Vref may be higher than Vw, for example.

Next, the data rewriting operation in a period from Time T04 to Time T05 is described.

Since the above-described reading operation is destructive reading, in which the direction of polarization is inverted, the data "1" retained in the memory cell 321e is lost. Thus, the potential of the wiring BIL is set to Vw and the potential of the wiring PL is set to GND in the period from Time T04 to Time T05, whereby data "1" is rewritten to the memory cell 321e.

At Time T05, the potential of the wiring BIL and the potential of the wiring PL are set to GND. Then, the potential of the wiring WL is set to a low potential L. Thus, the rewriting operation is completed, and the data "1" is retained in the memory cell 321e.

Next, the reading operation and the operation of writing data "0" to the memory cell 321e in a period from Time T11 to Time T13 are described.

The potential of the wiring WL is set to a high potential H and the potential of the wiring PL is set to Vw in a period from Time T11 to Time T12. Since the data "1" is retained in the memory cell 321e, the potential of the wiring BIL becomes higher than Vref, and the data "1" retained in the memory cell 321e is read out.

The potential of the wiring BIL is set to GND in a period from Time T12 to Time T13. Since the transistor 276 is in an on state, the potential of the one electrode of the capacitor 277 becomes GND. In addition, the potential of the wiring PL is set to Vw. Through this, the voltage applied to the ferroelectric layer of the capacitor 277 becomes "GND-Vw". Accordingly, data "0" can be written to the memory cell 321e.

Next, at Time T13, the potential of the wiring BIL and the potential of the wiring PL are each set to GND; accordingly, the voltage applied to the ferroelectric layer of the capacitor 277 becomes 0 V. When the voltage "GND-Vw" applied to the ferroelectric layer of the capacitor 277 is lower than or equal to −VSP in the period from Time T12 to Time T13, the amount of polarization of the ferroelectric layer of the capacitor 277 is varied according to the curve 71 shown in FIG. 14A until it reaches the position of 0 V in a period from Time T13 to Time T14. Thus, the direction of polarization is maintained in the ferroelectric layer of the capacitor 277.

After the potential of the wiring BIL and the potential of the wiring PL are set to GND, the potential of the wiring WL is set to a low potential L, whereby the transistor 276 is turned off. Thus, the writing operation is completed, and the data "0" is retained in the memory cell 321e.

Next, the data reading operation in a period from Time T14 to Time T15 is described.

In the period from Time T14 to Time T15, the potential of the wiring WL is set to a high potential H, whereby the transistor 276 is turned on. In addition, the potential of the wiring PL is set to Vw. With the potential of the wiring PL set to Vw, the voltage applied to the ferroelectric layer of the capacitor 277 becomes "GND-Vw".

At this time, the voltage applied to the ferroelectric layer of the capacitor 277 becomes "GND-Vw", which is the same as the voltage at the time of the data writing; accordingly, no polarization inversion occurs in the ferroelectric layer of the capacitor 277. Thus, the amount of current flowing through the wiring BIL is smaller than that in the case where polarization inversion occurs in the ferroelectric layer of the capacitor 277. Accordingly, an increase in the potential of the wiring BIL is smaller too. Specifically, the potential of the wiring BIL becomes lower than or equal to Vref; thus, the data "0" retained in the memory cell 321e can be read out by operation of the sense amplifier.

Next, the data rewriting operation in a period from Time T15 to Time T17 is described.

The potential of the wiring BIL is set to GND and the potential of the wiring PL is set to Vw in the period from Time T15 to Time T16. Through this operation, data "0" is rewritten to the memory cell 321e.

In a period from Time T16 to Time T17, the potential of the wiring BIL and the potential of the wiring PL are set to GND. Then, the potential of the wiring WL is set to a low potential L. Thus, the rewriting operation is completed, and the data "0" is retained in the memory cell 321e.

Next, the data reading and the operation of writing data "1" to the memory cell 321e in a period from Time T17 to Time T19 are described.

The potential of the wiring WL is set to a high potential H and the potential of the wiring PL is set to Vw in a period from Time T17 to Time T18. Since the data "0" is retained in the memory cell 321e, the potential of the wiring BIL becomes lower than Vref, and the data "0" retained in the memory cell 321e is read out.

The potential of the wiring BIL is set to Vw in a period from Time T18 to Time T19. Since the transistor 276 is in an on state, the potential of the one electrode of the capacitor 277 becomes Vw. In addition, the potential of the wiring PL is set to GND. Through this, the voltage applied to the ferroelectric layer of the capacitor 277 becomes "Vw-GND". Accordingly, data "1" can be written to the memory cell 321e.

After Time T19, the potential of the wiring BIL and the potential of the wiring PL are set to GND. Then, the potential of the wiring WL is set to a low potential L. Thus, the writing operation is completed, and the data "1" is retained in the memory cell 321e.

Although the above is an operation example of the memory cell 321e, other methods may be employed for the operation of data writing, reading, rewriting, or the like.

<Stacked-Layer Structure 1>

Next, a stacked-layer structure of the imaging device is described with reference to a cross-sectional view.

Figure 15:
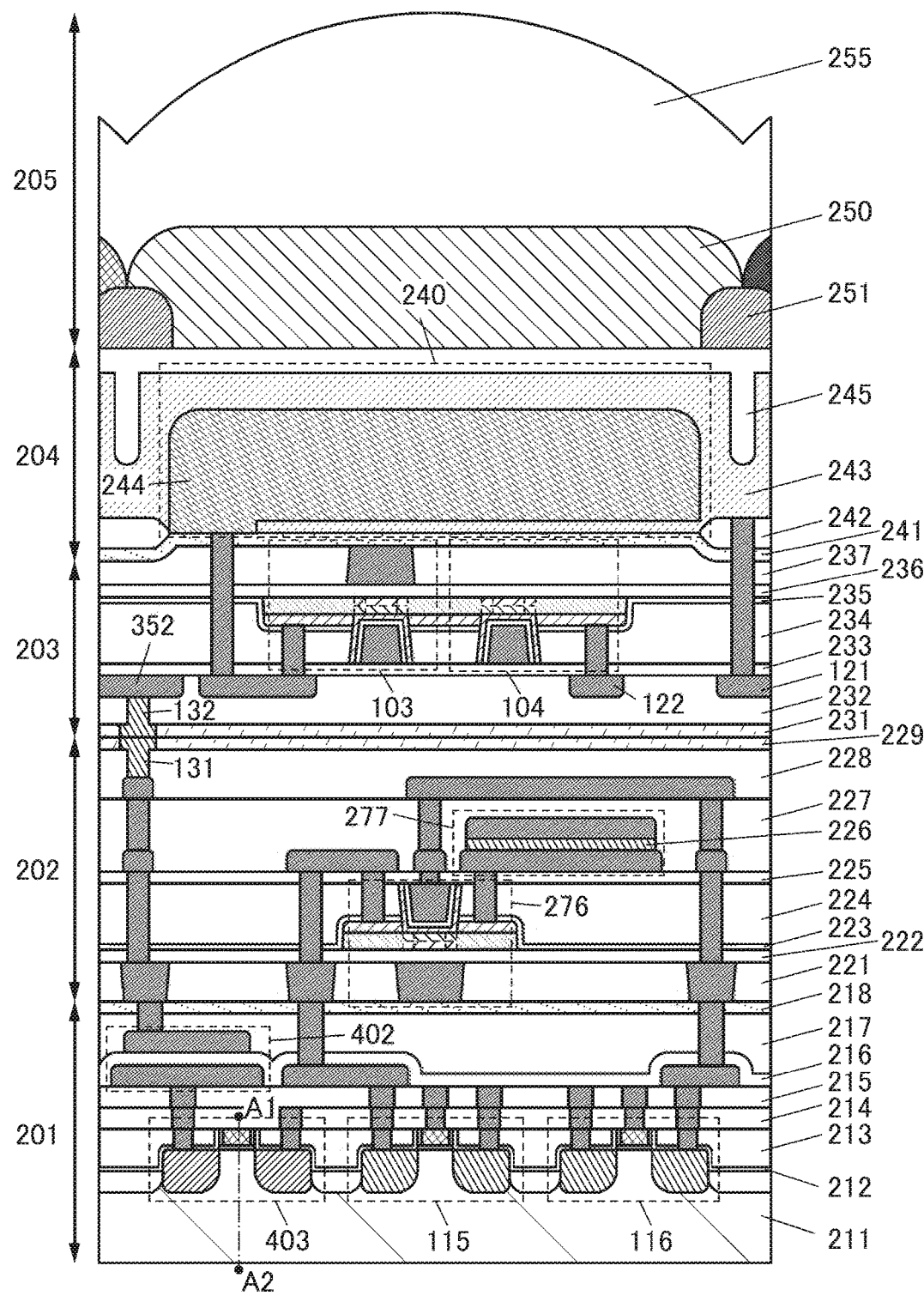
FIG. 15 is a cross-sectional view illustrating a pixel.

FIG. 15 is an example of a cross-sectional view of a stacked body that includes the layer 201 to the layer 205 and has a bonding plane between the layer 202 and the layer 203. FIG. 15 corresponds to the stacked body illustrated in FIG. 1.

<Layer 201>

The layer 201 includes the reading circuit 311, the row driver 312, and the column driver 313 provided on a silicon substrate 211. Here, as parts of the circuits, the capacitor 402 and the transistor 403 included in the CDS circuit of the reading circuit 311, a transistor 115 included in the A/D converter of the reading circuit 311, and a transistor 116 included in the row driver 312 are shown. The one electrode of the capacitor 402 is electrically connected to one of a source and a drain of the transistor 403.

Insulating layers 212, 213, 214, 215, 216, 217, and 218 are provided in the layer 201. The insulating layer 212 functions as a protective film. The insulating layers 213, 214, 215, and 217 function as interlayer insulating films and planarization films. The insulating layer 216 functions as a dielectric layer of the capacitor 402. The insulating layer 218 functions as a blocking film.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. As the blocking film, a film that has a function of preventing hydrogen diffusion is preferably used.

In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

Figure 16A:
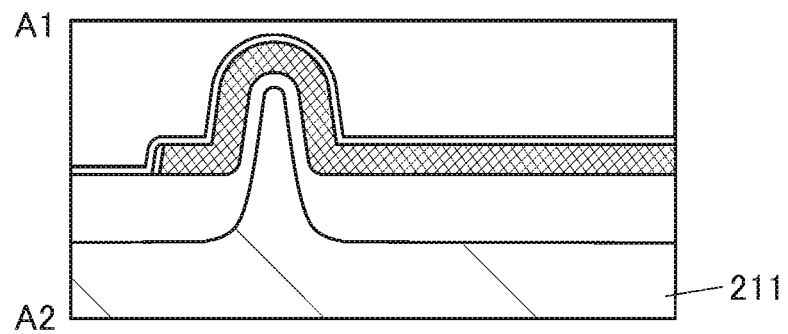
FIG. 16A to FIG. 16C are diagrams each illustrating a Si transistor.
Figure 16B:
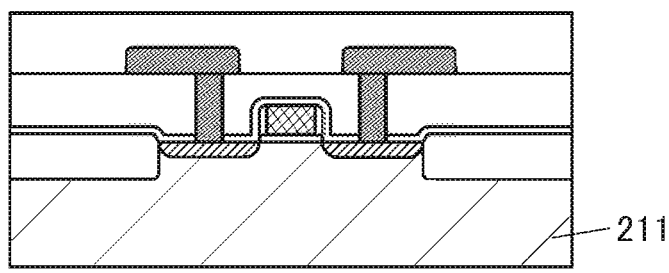

The Si transistors illustrated in FIG. 15 each have a fin-type structure including a channel formation region in the silicon substrate 211, and FIG. 16A shows a cross section (an A1-A1 cross section in FIG. 15) in the channel width direction. Note that the Si transistors may each have a planar-type structure as illustrated in FIG. 16B.

Figure 16C:
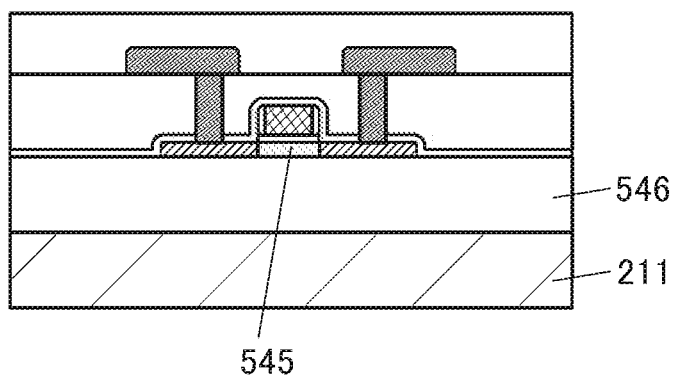

Alternatively, as illustrated in FIG. 16C, a transistor including a semiconductor layer 545 of a silicon thin film may be used. The semiconductor layer 545 can be single crystal silicon (SOI (Silicon on Insulator)) formed on an insulating layer 546 on the silicon substrate 211, for example.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 202>

The layer 202 is formed over the layer 201. The layer 202 includes the memory circuit 321 including an OS transistor. Here, the transistor 276 and the capacitor 277 which are included in the memory cell 321e illustrated in FIG. 13B and FIG. 13C are shown as part of the memory circuit 321. The capacitor 277 is a ferroelectric capacitor which includes a ferroelectric layer 226. Note that the memory cell 321e may be replaced with the memory cell 321b, the memory cell 321c, or the memory cell 321d which are illustrated in the FIG. 12B, FIG. 12C, and FIG. 12D respectively.

Insulating layers 221, 222, 223, 224, 225, 227, 228, and 229 are provided in the layer 202. Moreover, a conductive layer 131 is provided.

The insulating layers 221, 224, 225, 227, and 228 function as interlayer insulating films and planarization films. The insulating layer 222 functions as a gate insulating film. The insulating layer 223 functions as a protective film. The insulating layer 229 and the conductive layer 131 function as bonding layers.

As the gate insulating film, a silicon oxide film or the like can be used. The bonding layers will be described later.

The conductive layer 131 is electrically connected to the other electrode of the capacitor 402 in the layer 201. One of a source and a drain of the transistor 276 is electrically connected to one of a source and a drain of the transistor 115 in the layer 201. A gate of the transistor 276 is electrically connected to one of a source and a drain of the transistor 116 in the layer 201. The other of the source and the drain of the transistor 276 is electrically connected to one electrode of the capacitor 277.

Figure 17A:
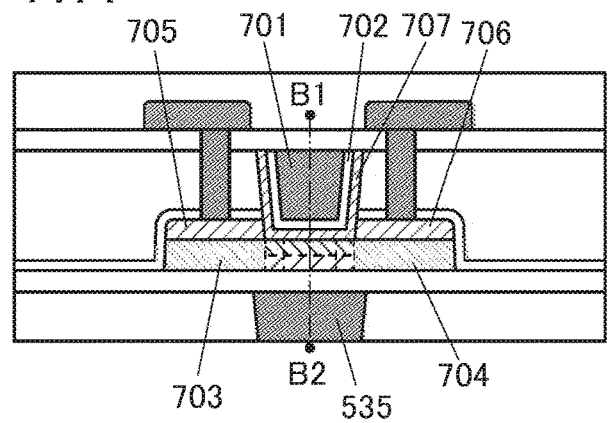
FIG. 17A to FIG. 17D are diagrams each illustrating an OS transistor.

The details of an OS transistor are illustrated in FIG. 17A. The OS transistor illustrated in FIG. 17A has a self-aligned structure in which a source electrode 705 and a drain electrode 706 are formed through provision of an insulating layer over a stacked layer of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The groove may further be provided with an oxide semiconductor layer 707.

Figure 17B:
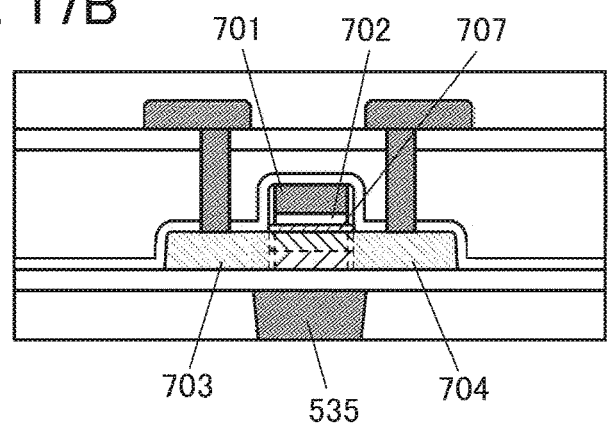

As illustrated in FIG. 17B, the OS transistor may have a self-aligned structure in which the source region 703 and the drain region 704 are formed in the semiconductor layer with the gate electrode 701 as a mask.

Figure 17C:
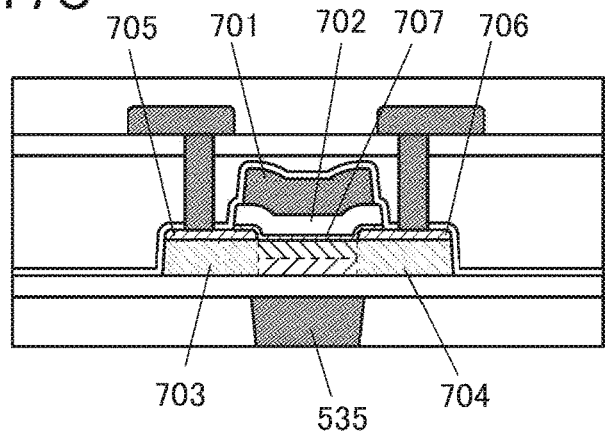

As illustrated in FIG. 17C, the OS transistor may be a non-self-aligned top-gate transistor including a region where the source electrode 705 or the drain electrode 706 overlaps with the gate electrode 701.

Figure 17D:
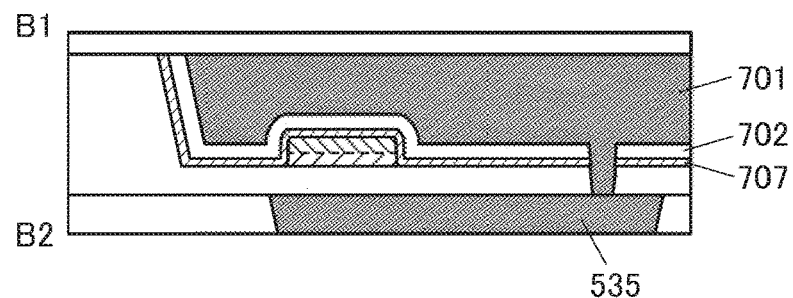

Although the OS transistor has a structure with a back gate 535, it may have a structure without a back gate. As illustrated in a cross-sectional view of the transistor in the channel width direction in FIG. 17D, the back gate 535 may be electrically connected to a front gate of the transistor, which is provided to face the back gate. Note that FIG. 17D illustrates an example of a B1-B2 cross section of the transistor in FIG. 17A, and the same applies to a transistor having any of the other structures. Different fixed potentials may be supplied to the back gate 535 and the front gate.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In—M—Zn-based oxide that contains indium, zinc, and M (one or more of metals such as aluminum, titanium, gallium, germanium, yttrium, zirconium, lanthanum, cerium, tin, neodymium, and hafnium). The In—M—Zn-based oxide can be typically formed by a sputtering method. Alternatively, the In—M—Zn-based oxide may be formed by an ALD (Atomic layer deposition) method.

It is preferable that the atomic ratio of metal elements of a sputtering target used for forming the In—M—Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or InOxi as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or InOxi as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

<Layer 203>

The layer 203 is formed over the layer 202. The layer 203 includes the pixel circuit 331 including an OS transistor. Here, the transistor 103 and the transistor 104 are shown as part of the pixel circuit 331.

Insulating layers 231, 232, 233, 234, 235, 236, and 237 are provided in the layer 203. Moreover, a conductive layer 132 is provided.

The insulating layer 231 and the conductive layer 132 function as bonding layers. The insulating layers 232, 233, 234, and 237 function as interlayer insulating films and planarization films. The insulating layer 235 functions as a protective film. The insulating layer 236 functions as a gate insulating film.

The conductive layer 132 is electrically connected to the wiring 352 functioning as the output line of the pixel circuit 331.

<Layer 204>

The layer 204 includes the photoelectric conversion device 240 and insulating layers 241, 242, and 245.

The photoelectric conversion device 240 is a pn-junction photodiode formed on a silicon substrate and includes a p-type region 243 and an n-type region 244. The photoelectric conversion device 240 is a pinned photodiode, which can suppress dark current and reduce noise with the thin p-type region 243 provided on the surface side (current extraction side) of the n-type region 244.

The insulating layer 241 functions as a blocking layer. The insulating layer 242 functions as an element isolation layer. The insulating layer 245 has a function of suppressing carrier leakage.

The silicon substrate is provided with a groove that separates pixels, and the insulating layer 245 is provided on the top surface of the silicon substrate and in the groove. The insulating layer 245 can suppress leakage of carriers generated in the photoelectric conversion device 240 to an adjacent pixel. The insulating layer 245 also has a function of suppressing entry of stray light. Therefore, color mixture can be suppressed with the insulating layer 245. Note that an anti-reflection film may be provided between the top surface of the silicon substrate and the insulating layer 245.

The element isolation layer can be formed by a LOCOS (LOCal Oxidation of Silicon) method, an STI (Shallow Trench Isolation) method, or the like. As the insulating layer 245, for example, an inorganic insulating film of silicon oxide, silicon nitride, or the like or an organic insulating film of a polyimide resin, an acrylic resin, or the like can be used. The insulating layer 245 may have a multilayer structure.

The n-type region 244 (corresponding to a cathode) of the photoelectric conversion device 240 is electrically connected to the one of the source and the drain of the transistor 103 in the layer 203. The p-type region 243 (anode) is electrically connected to the wiring 121 functioning as the power supply line in the layer 203.

<Layer 205>

The layer 205 is formed over the layer 204. The layer 205 includes a light-blocking layer 251, the optical conversion layer 250, and the microlens array 255.

Figure 22A:
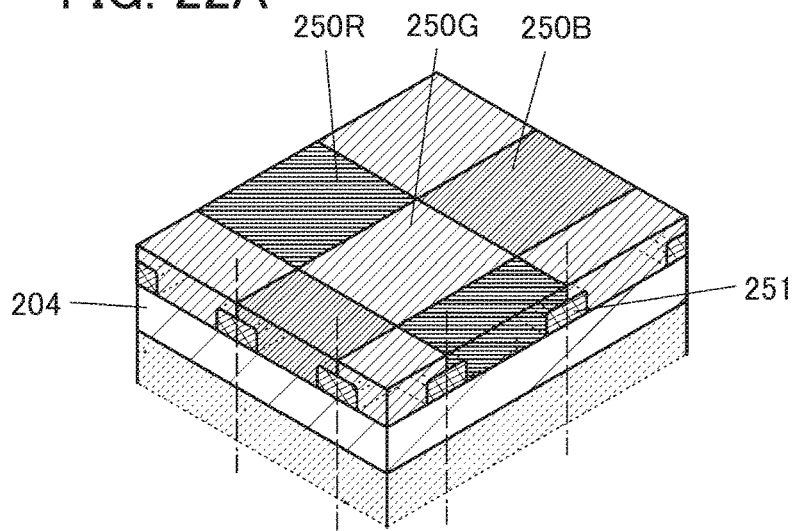
FIG. 22A to FIG. 22C are perspective views (cross-sectional views) each illustrating pixels.

The light-blocking layer 251 can suppress entry of light into an adjacent pixel. As the light-blocking layer 251, a metal layer of aluminum, tungsten, or the like can be used. The metal layer and a dielectric film functioning as an anti-reflection film may be stacked. When the photoelectric conversion device 240 has sensitivity to visible light, a color filter can be used as the optical conversion layer 250. When color filters of R (red), G (green), B (blue), Y (yellow), C (cyan), M (magenta), and the like are assigned to different pixels, a color image can be obtained. For example, as illustrated in a perspective view (including a cross section) of FIG. 22A, a color filter 250R (red), a color filter 250G (green), and a color filter 250B (blue) can be assigned to different pixels.

When a wavelength cut filter is used as the optical conversion layer 250 in the appropriate combination of the photoelectric conversion device 240 and the optical conversion layer 250, the imaging device can capture images in various wavelength regions.

For example, when an infrared filter that blocks light having a wavelength shorter than or equal to that of visible light is used as the optical conversion layer 250, an infrared imaging device can be obtained. When a filter that blocks light having a wavelength shorter than or equal to that of near infrared light is used as the optical conversion layer 250, a far-infrared imaging device can be obtained. When an ultraviolet filter that blocks light having a wavelength longer than or equal to that of visible light is used as the optical conversion layer 250, an ultraviolet imaging device can be obtained.

Figure 22B:
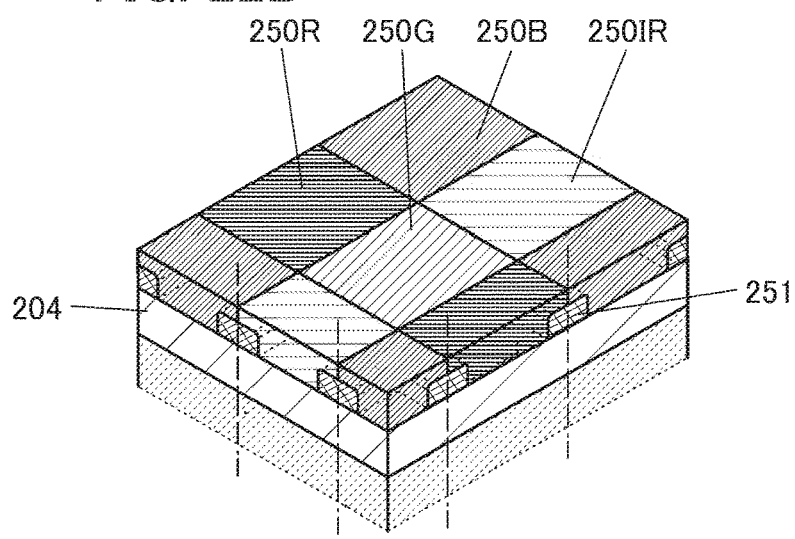

Note that different optical conversion layers may be provided in one imaging device. For example, as illustrated in FIG. 22B, the color filter 250R (red), the color filter 250G (green), the color filter 250B (blue), and an infrared filter 250IR can be assigned to different pixels. With this structure, a visible light image and an infrared light image can be obtained simultaneously.

Figure 22C:
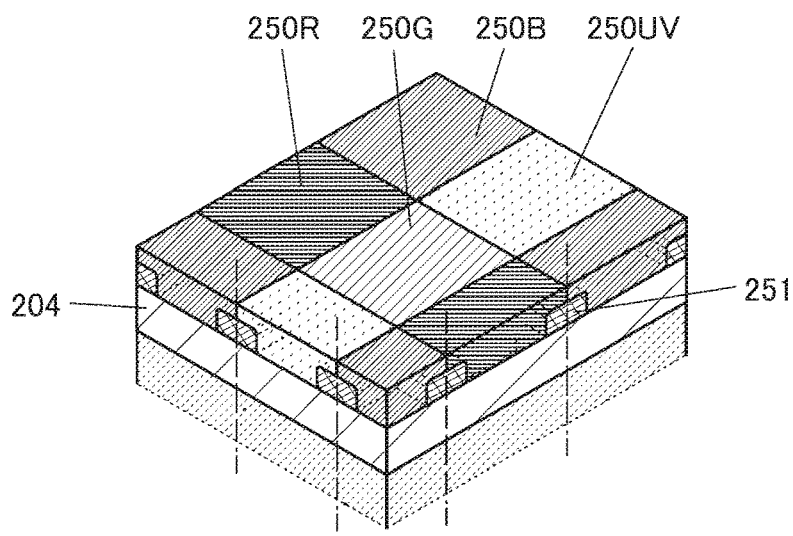

Alternatively, as illustrated in FIG. 22C, the color filter 250R (red), the color filter 250G (green), the color filter 250B (blue), and an ultraviolet filter 250UV can be assigned to different pixels. With this structure, a visible light image and an ultraviolet light image can be obtained simultaneously.

Furthermore, when a scintillator is used as the optical conversion layer 250, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 240 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, $BaFC_1$.Eu, NaI, CsI, $CaF_2$, $BaF_2$, $CeF_3$, LiF, LiI, ZnO, or the like is dispersed can be used.

Image capturing with the use of infrared light or ultraviolet light can provide the imaging device with an inspection function, a security function, a sensor function, or the like. For example, by image capturing with the use of infrared light, non-destructive inspection of products, sorting of agricultural products (e.g., sugar content meter function), vein authentication, medical inspection, or the like can be performed. Furthermore, by image capturing with the use of ultraviolet light, detection of ultraviolet light released from a light source or a frame can be performed, whereby a light source, a heat source, a production device, or the like can be controlled, for example.

The microlens array 255 is provided over the optical conversion layer 250. Light passing through an individual lens of the microlens array 255 goes through the optical conversion layer 250 directly under the lens, and the photoelectric conversion device 240 is irradiated with the light. With the microlens array 255, collected light can be incident on the photoelectric conversion device 240; thus, photoelectric conversion can be efficiently performed. The microlens array 255 is preferably formed using a resin, glass, or the like having a high light transmitting property with respect to light with an intended wavelength.

<Bonding>

Next, bonding of the layer 202 and the layer 203 will be described.

The insulating layer 229 and the conductive layer 131 are provided in the layer 202. The conductive layer 131 includes a region embedded in the insulating layer 229. Furthermore, the surfaces of the insulating layer 229 and the conductive layer 131 are planarized to be level with each other.

The insulating layer 231 and the conductive layer 132 are provided in the layer 203. The conductive layer 132 includes a region embedded in the insulating layer 232. Furthermore, the surfaces of the insulating layer 231 and the conductive layer 132 are planarized to be level with each other.

Here, a main component of the conductive layer 131 and a main component of the conductive layer 132 are preferably the same metal element. Furthermore, the insulating layer 229 and the insulating layer 231 are preferably formed of the same component.

For the conductive layers 131 and 132, Cu, Al, Sn, Zn, W, Ag, Pt, or Au can be used, for example. Preferably, Cu, Al, W, or Au is used for easy bonding. In addition, for the insulating layers 229 and 231, silicon oxide, silicon oxynitride, silicon nitride oxide, silicon nitride, titanium nitride, or the like can be used.

That is, the same metal material described above is preferably used for the conductive layer 131 and the conductive layer 132. Furthermore, the same insulating material described above is preferably used for the insulating layer 229 and the insulating layer 231. With this structure, bonding can be performed at the boundary between the layer 202 and the layer 203.

Note that the conductive layer 131 and the conductive layer 132 may each have a multilayer structure of a plurality of layers; in that case, the outer layers (bonding surfaces) are formed of the same metal material. The insulating layer 229 and the insulating layer 231 may each have a multilayer structure of a plurality of layers; in that case, the outer layers (bonding surfaces) are formed of the same insulating material.

Through the above bonding, the electrical connection between the conductive layer 131 and the conductive layer 132 can be obtained. Moreover, the connection between the insulating layer 229 and the insulating layer 231 with mechanical strength can be obtained.

For a direct bond between the metal layers, a surface activated bonding method in which an oxide film, a layer adsorbing impurities, and the like on the surfaces are removed by sputtering treatment or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for a direct bond between the insulating layers, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 202 and the layer 203 are bonded to each other, the insulating layers and the metal layers coexist on their bonding surfaces; therefore, the surface activated bonding method and the hydrophilic bonding method are performed in combination, for example. For example, it is possible to use a method in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the pixel circuit 331 included in the layer 203 to be electrically connected to the reading circuit 311 included in the layer 201.

<Modification Example of Stacked-Layer Structure 1>

Figure 18:
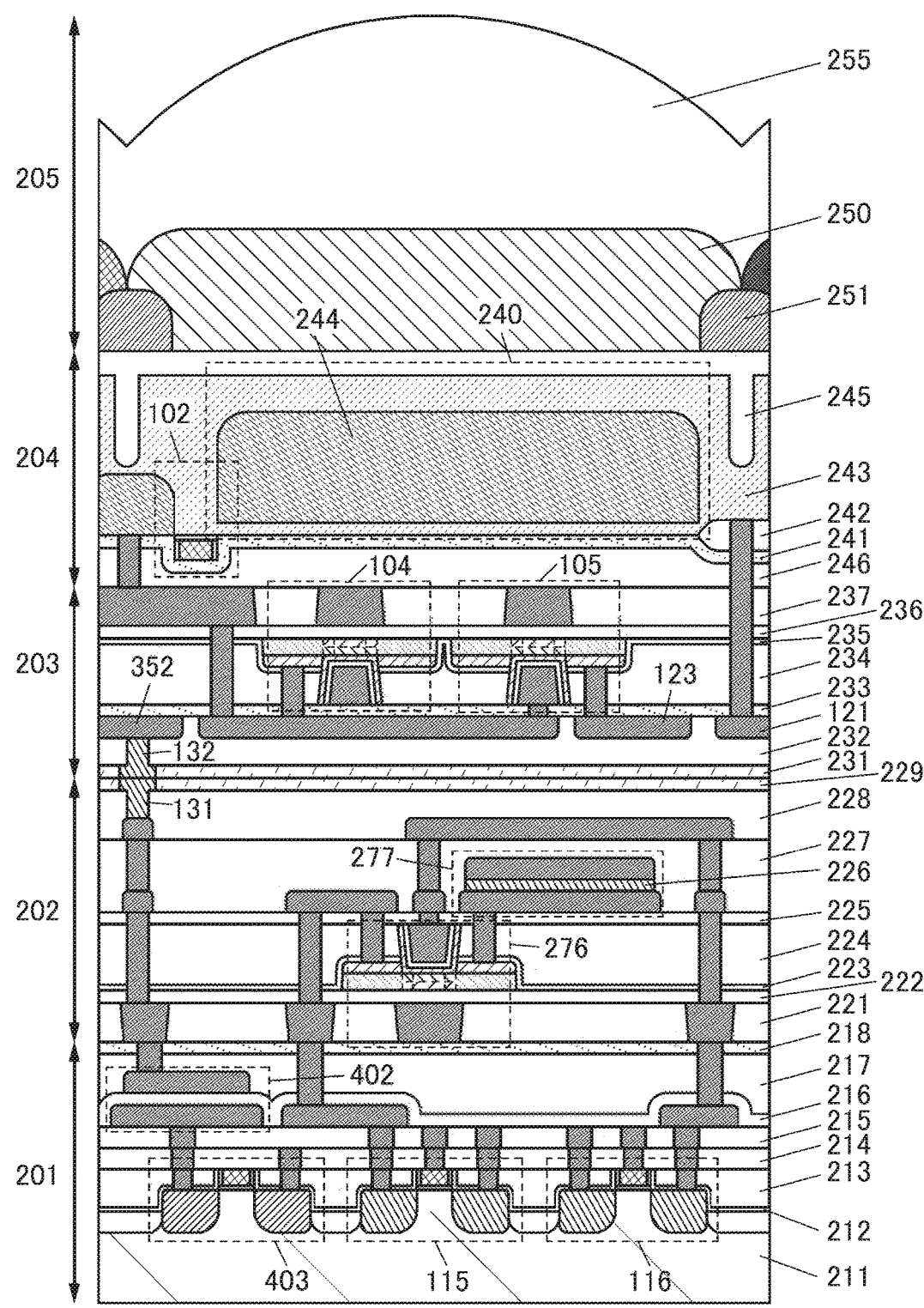
FIG. 18 is a cross-sectional view illustrating a pixel.

FIG. 18 illustrates a modification example in which the layer 203 and the layer 204 have structures different from those in the stacked-layer structure 1 illustrated in FIG. 15. The modification example illustrated in FIG. 18 has a structure in which a transistor 102 included in the pixel circuit 331 is provided in the layer 204. The transistor 103 is formed of a Si transistor in the layer 204. The one of the source and the drain of the transistor 103 is directly connected to the photoelectric conversion device 240 and the other of the source and the drain of the transistor 103 functions as the node FD.

In that case, the transistors other than the transistor 103 included in the pixel circuit 331 are provided in the layer 203. The transistor 104 and the transistor 105 are illustrated in FIG. 18.

<Stacked-Layer Structure 2>

Figure 19:
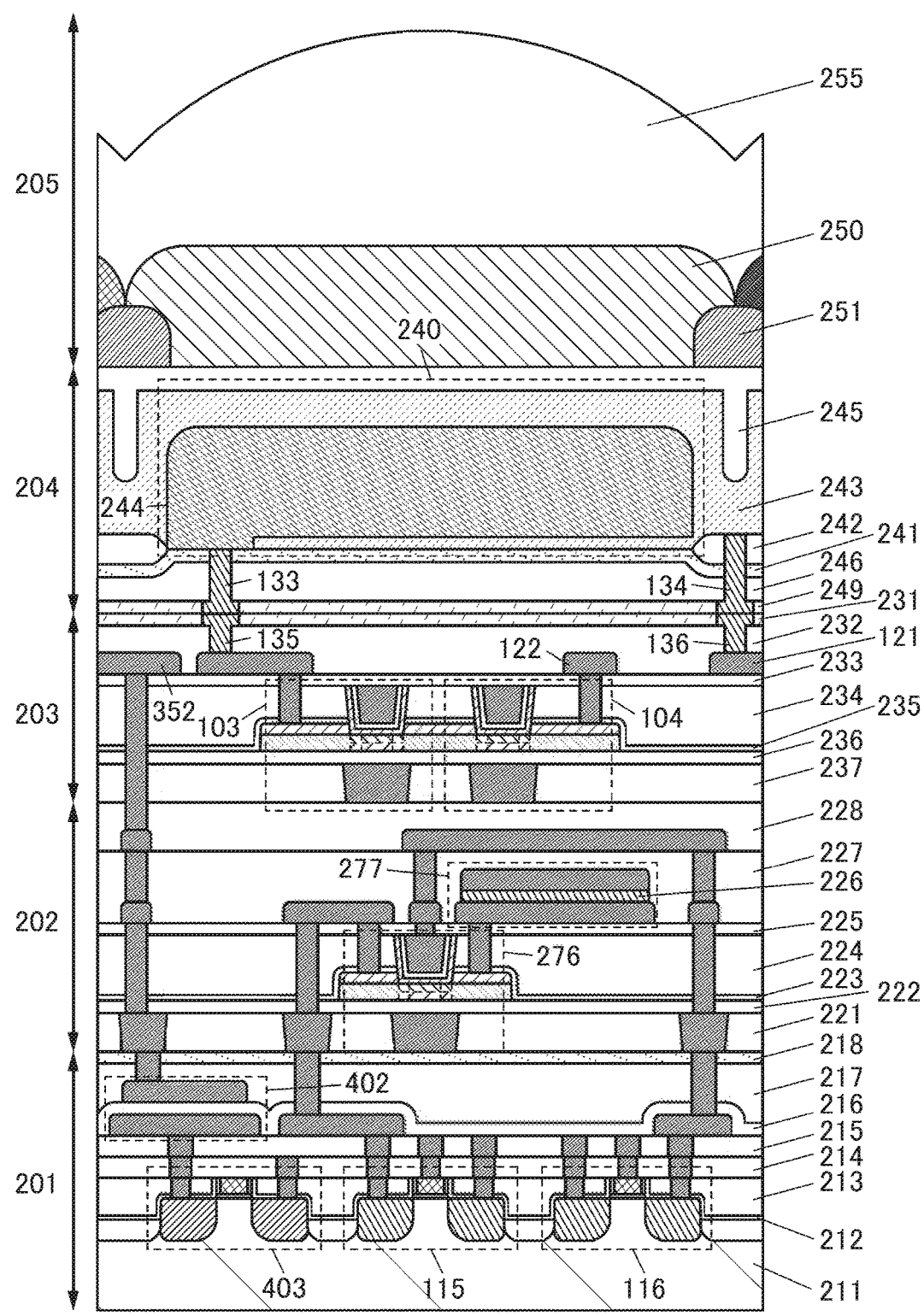
FIG. 19 is a cross-sectional view illustrating a pixel.

The structure in which the layer 202 and the layer 203 are bonded to each other is described in each of the stacked-layer structure 1 and its modification examples; however, bonding may be performed between other layers. The stacked-layer structure 2 illustrated in FIG. 19 is a structure in which a bonding plane is between the layer 203 and the layer 204.

In that case, a conductive layer 135 electrically connected to the one of the source and the drain of the transistor 103 is provided in the layer 203. In addition, a conductive layer 136 electrically connected to the wiring 121 is provided. The conductive layers 135 and 136 each include a region embedded in the insulating layer 231. Furthermore, the surfaces of the insulating layer 231 and the conductive layers 135 and 136 are planarized to be level with each other.

A conductive layer 133 electrically connected to the n-type region 244 (corresponding to a cathode) of the photoelectric conversion device 240 is provided in the layer 204. In addition, a conductive layer 134 electrically connected to the p-type region 243 (anode) is provided. Furthermore, an insulating layer 249 is provided over the insulating layer 246. The conductive layers 133 and 134 each include a region embedded in the insulating layer 249. Furthermore, the surfaces of the insulating layer 249 and the conductive layers 133 and 134 are planarized to be level with each other.

Here, the conductive layers 133, 134, 135, and 136 are the same bonding layers as the above-described conductive layers 131 and 132. The insulating layer 249 is the same bonding layer as the above-described insulating layers 229 and 231.

Thus, when the conductive layer 133 and the conductive layer 135 are bonded to each other, the n-type region 244 (corresponding to a cathode) of the photoelectric conversion device 240 can be electrically connected to the one of the source and the drain of the transistor 103. In addition, when the conductive layer 134 and the conductive layer 136 are bonded to each other, the p-type region 243 (corresponding to an anode) of the photoelectric conversion device 240 can be electrically connected to the wiring 121. When the insulating layer 231 and the insulating layer 249 are bonded to each other, electrical bonding and mechanical bonding of the layer 203 and the layer 204 can be performed.

<Stacked-Layer Structure 3>

Figure 20:
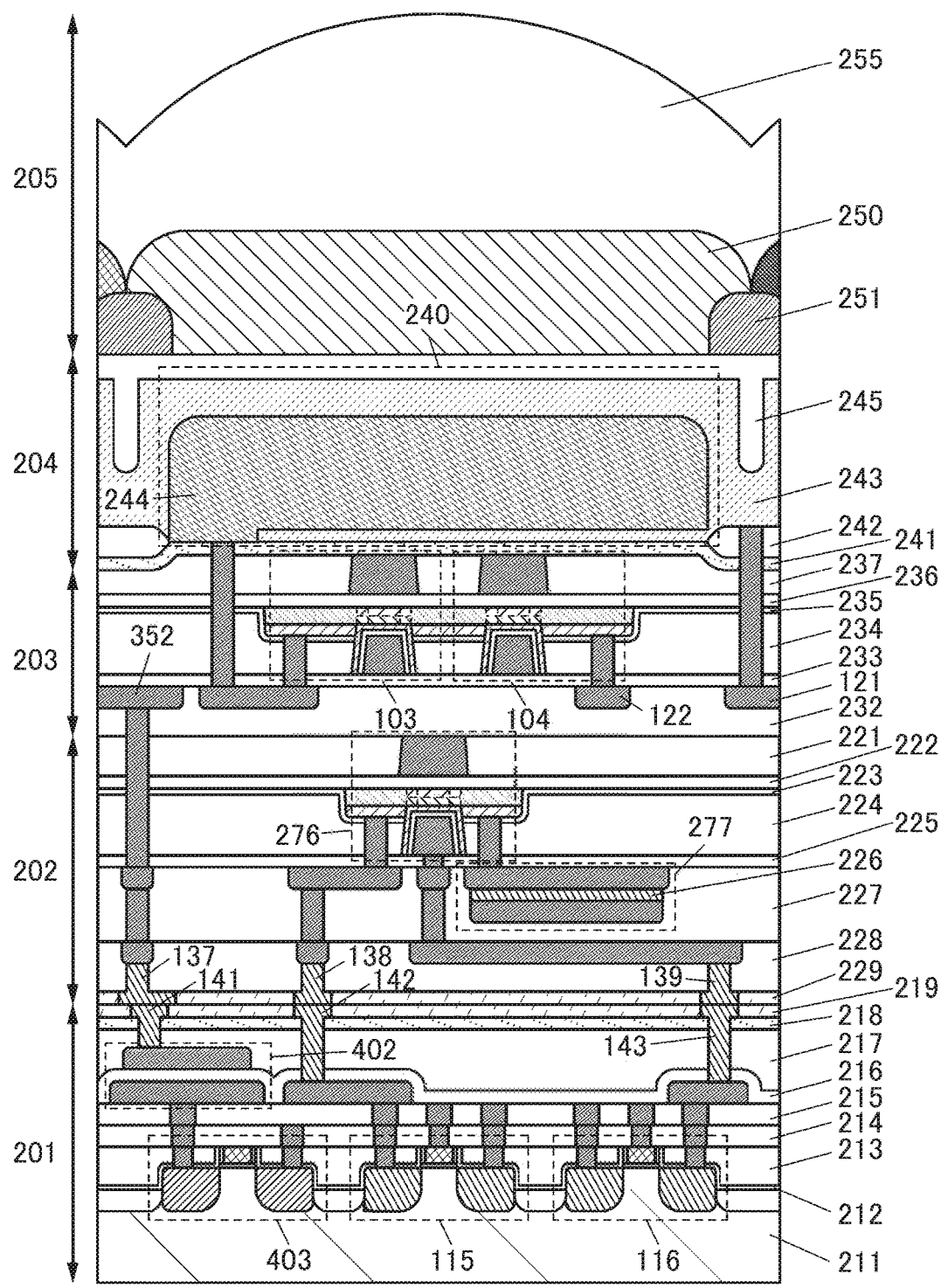
FIG. 20 is a cross-sectional view illustrating a pixel.

The stacked-layer structure 3 illustrated in FIG. 20 is a structure in which a bonding plane is between the layer 201 and the layer 202.

In that case, a conductive layer 141 electrically connected to the other electrode of the capacitor 402 is provided in the layer 201. In addition, a conductive layer 142 electrically connected to the one of the source and the drain of the transistor 115 is provided. Moreover, a conductive layer 143 electrically connected to the one of the source and the drain of the transistor 116 is electrically connected. An insulating layer 219 is provided over the insulating layer 218. The conductive layers 141, 142, and 143 each include a region embedded in the insulating layer 219. Furthermore, the surfaces of the insulating layer 219 and the conductive layers 141, 142, and 143 are planarized to be level with each other.

A conductive layer 137 electrically connected to the wiring 352 included in the layer 203 is provided in the layer 202. In addition, a conductive layer 138 electrically connected to the one of the source and the drain of the transistor 276 included in the layer 202 is provided. Furthermore, a conductive layer 139 electrically connected to the gate of the transistor 276 is provided. The conductive layers 137, 138, and 139 each include a region embedded in the insulating layer 229. Furthermore, the surfaces of the insulating layer 229 and the conductive layers 137, 138, and 139 are planarized to be level with each other.

Here, the conductive layers 137, 138, 139, 141, 142, and 143 are the same bonding layers as the above-described conductive layers 131 and 132. The insulating layer 219 is the same bonding layer as the above-described insulating layers 229 and 231.

Thus, when the conductive layer 137 and the conductive layer 141 are bonded to each other, the reading circuit 311 can be electrically connected to the pixel circuit 331. When the conductive layer 138 and the conductive layer 142 are bonded to each other, the column driver 313 can be electrically connected to the memory circuit 321. When the conductive layer 139 and the conductive layer 143 are bonded to each other, the row driver 312 can be electrically connected to the memory circuit 321.

Note that although this embodiment shows the structure in which the reading circuit of the pixel circuit and the driver circuit of the memory circuit are provided in the layer 201 and the memory circuit is provided in the layer 202, the present invention is not limited thereto. For example, a driver circuit of a pixel circuit, a neural network, a communication circuit, a CPU, or the like may be provided in the layer 201 or the layer 202.

A normally-off CPU (also referred to as "Noff-CPU") can be formed using an OS transistor and a Si transistor. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

<Stacked-Layer Structure 4>

Figure 21:
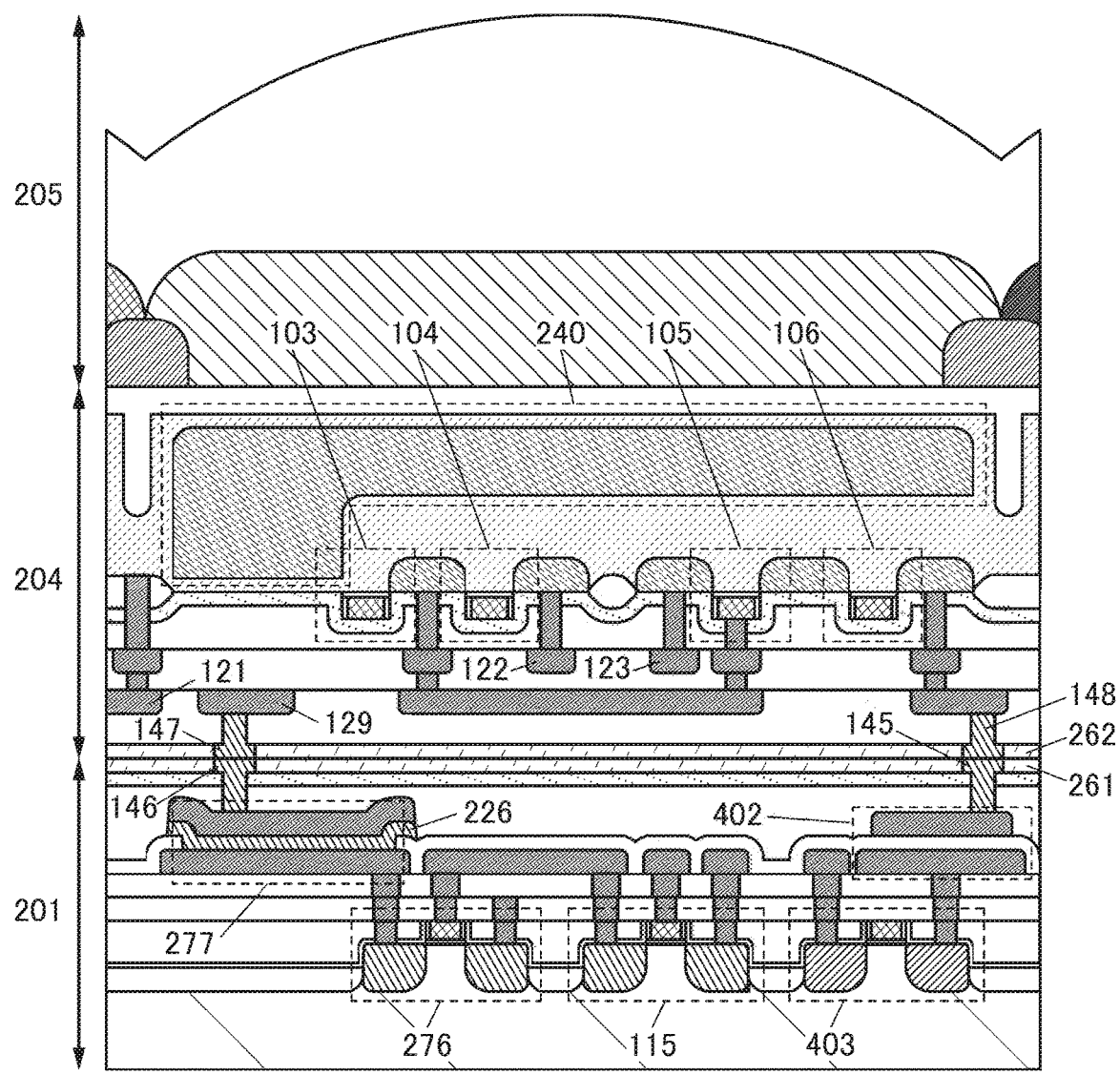
FIG. 21 is a cross-sectional view illustrating a pixel.

FIG. 21 is an example of a cross-sectional view of a stacked body that includes the layer 201 and the layer 204 and has a bonding plane between the layer 201 and the layer 204. FIG. 21 corresponds to the stacked body illustrated in FIG. 4. FIG. 21 shows an example of a structure in which the transistors 115, 276, and 403, which are Si transistors, the capacitor 277, and the capacitor 402 are provided in the layer 201 and the transistors 103, 104, 105, and 106, which are Si transistors, and the photoelectric conversion device 240 are provided in the layer 204. The same components as those in the above-described stacked-layer structures are omitted as appropriate.

Here, the capacitor 402 and the transistor 403 included in the layer 201 are components included in the CDS circuit in the reading circuit 311. The capacitor 277 and the transistor 276 are components included in the memory cell 321e. The capacitor 277 is a ferroelectric capacitor. The transistors 103, 104, 105, and 106 included in the layer 204 are components included in the pixel circuit 331.

A conductive layer 145 electrically connected to the other electrode of the capacitor 402 is provided in the layer 201. In addition, a conductive layer 146 electrically connected to the other electrode of the capacitor 277 is provided. The layer 201 includes an insulating layer 261, and the conductive layers 145 and 146 each include a region embedded in the insulating layer 261. The surfaces of the insulating layer 261 and the conductive layers 145 and 146 are planarized to be level with each other.

A conductive layer 148 electrically connected to the other of the source and the drain of the transistor 106 is provided in the layer 204. In addition, a conductive layer 147 electrically connected to a wiring 129 is provided. The layer 204 includes an insulating layer 262, and the conductive layers 147 and 148 each include a region embedded in the insulating layer 262. The surfaces of the insulating layer 262 and the conductive layers 147 and 148 are planarized to be level with each other.

Here, the conductive layers 145, 146, 147, and 148 are the same bonding layers as the above-described conductive layers 131 and 132. The insulating layers 261 and 262 are the same bonding layers as the above-described insulating layers 229 and 231. The wiring 129 corresponds to the wiring PL illustrated in FIG. 13B and FIG. 13C.

Thus, when the conductive layer 145 and the conductive layer 148 are bonded to each other, the reading circuit 311 can be electrically connected to the pixel circuit 331. When the conductive layer 146 and the conductive layer 147 are bonded to each other, the other electrode of the capacitor 277 can be electrically connected to the wiring 129. The wiring 129 may be provided in the layer 201

This embodiment can be combined with the description of the other embodiments as appropriate.

Embodiment 2

In this embodiment, examples of a package and a camera module in each of which an image sensor chip is placed will be described. For the image sensor chip, the structure of the imaging device of one embodiment of the present invention can be used.

Figure 23A:
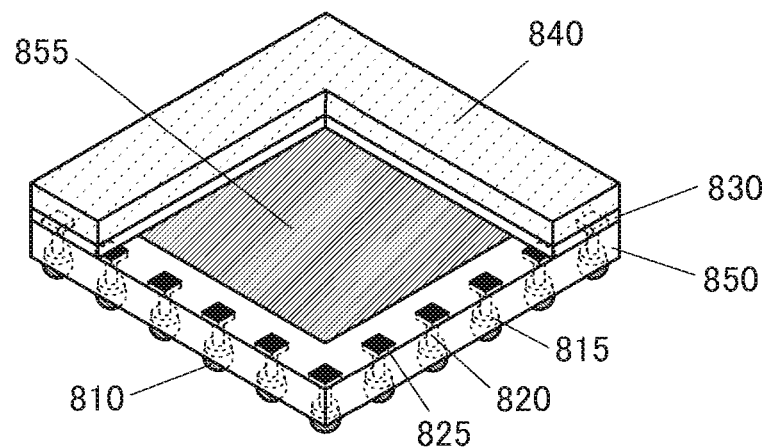
FIG. 23A is a diagram illustrating a package including an imaging device.

FIG. 23A is an external perspective view of a package containing an image sensor chip. The package is a CSP (Chip Size Package), which includes a bare chip 850 of an image sensor, cover glass 840, an adhesive 830 that bonds them, and the like.

Electrode pads 825 provided on the outside of a pixel array 855 are electrically connected to back electrodes 815 via through electrodes 820. The electrode pads 825 are electrically connected to a circuit forming the image sensor, with wirings or wires. Note that the bare chip 850 may be a stacked chip in which a circuit having various functions is stacked.

The example in FIG. 23A illustrates a BGA (Ball Grid Array) with a structure in which bumps 810 are formed with solder balls on the back electrodes 815. Note that, without being limited to the BGA, an LGA (Land Grid Array), a PGA (Pin Grid Array), or the like may be employed. Alternatively, a package in which the bare chip 850 is mounted on a QFN (Quad Flat No-lead package) or a QFP (Quad Flat Package) may be used.

Figure 23B:
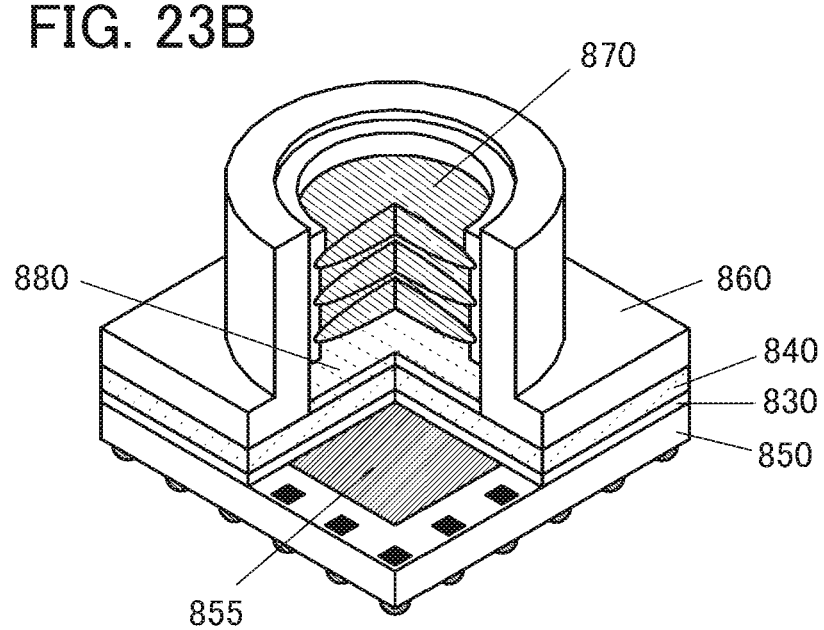
FIG. 23B is a diagram illustrating a module including an imaging device.

FIG. 23B is an external perspective view from the top surface side of a camera module with a combination of an image sensor chip and a lens. The camera module includes a lens cover 860, a plurality of lenses 870, and the like over the structure of FIG. 23A. In addition, an optical filter 880 that absorbs light with a certain wavelength is provided as needed between the lens 870 and the cover glass 840. For example, in the case where the image sensor mainly performs visible light imaging, an infrared cut filter or the like can be used as the optical filter 880.

The image sensor chip placed in a package having the above-described form can be easily mounted on a printed substrate or the like, and the image sensor chip can be incorporated in a variety of semiconductor devices and electronic devices.

This embodiment can be combined with the description of the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 24A to FIG. 24F illustrate specific examples of these electronic devices.

Figure 24A:
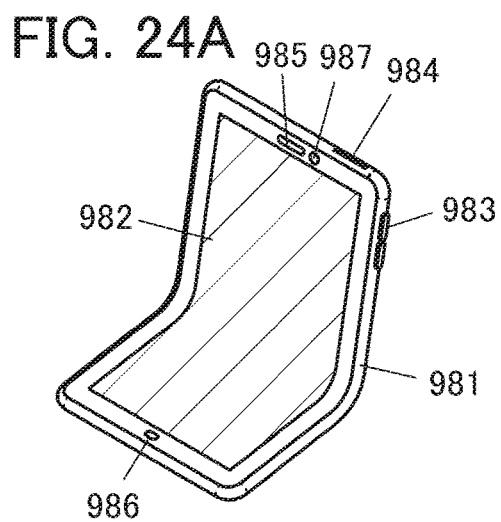
FIG. 24A to FIG. 24F are diagrams each illustrating an electronic device.

FIG. 24A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting a character can be performed by touch on the display portion 982 with a finger, a stylus, or the like. The imaging device of one embodiment of the present invention can be used in the mobile phone.

Figure 24B:
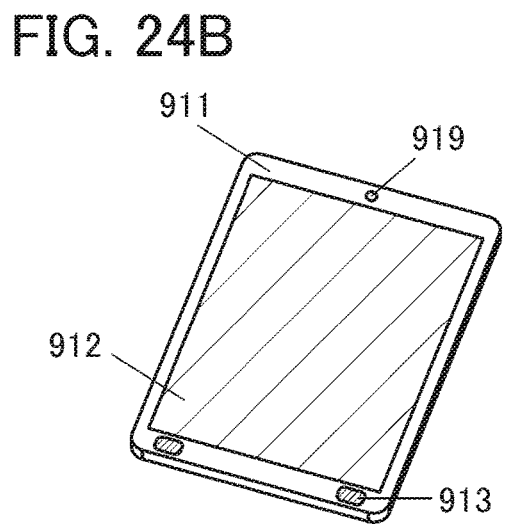

FIG. 24B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention can be used in the portable data terminal.

Figure 24C:
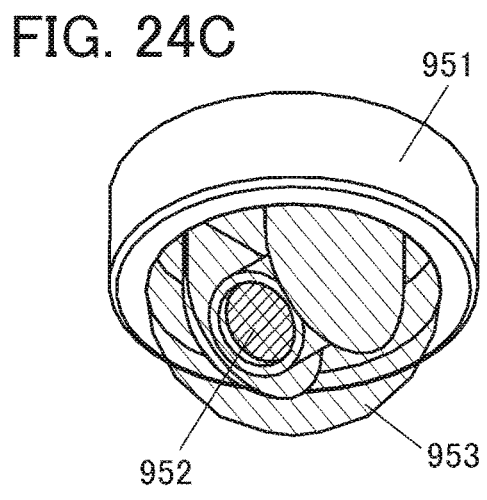

FIG. 24C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention can be used for obtaining an image in the camera unit. Note that a surveillance camera is a name in common use and does not limit the use thereof. A device that has a function of a surveillance camera can also be called a camera or a video camera, for example.

Figure 24D:
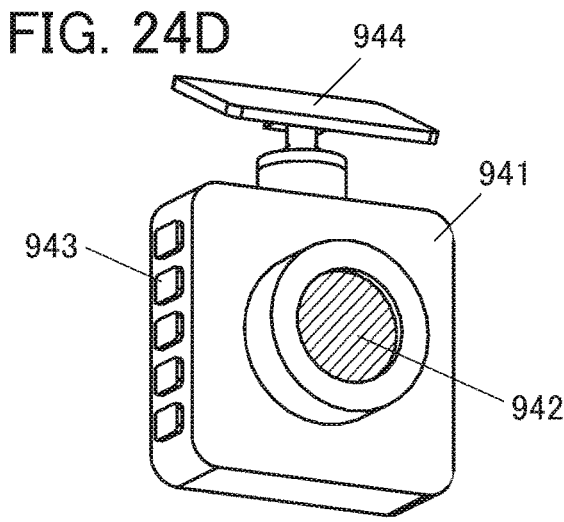

FIG. 24D is a dashboard camera, which includes a frame 941, a camera 942, an operation button 943, an attaching part 944, and the like. The dashboard camera is set on the windshield or the like of the automobile by the attaching part 944 so that the dashboard camera can record the view ahead during the driving. Note that a display panel displaying the image being recorded is provided on a rear surface, which is not illustrated. The imaging device of one embodiment of the present invention can be used in the camera 942.

Figure 24E:
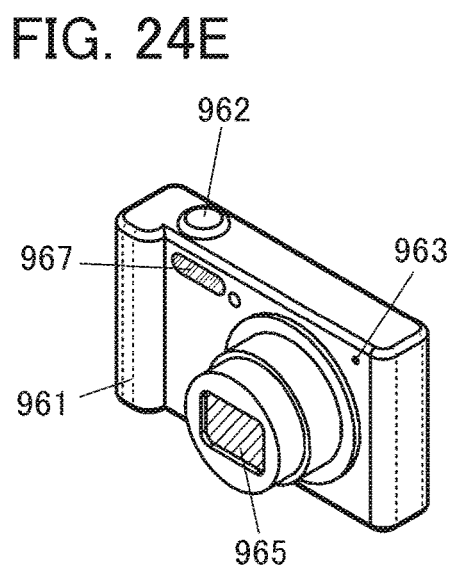

FIG. 24E is a digital camera, which includes a housing 961, a shutter button 962, a microphone 963, a light-emitting portion 967, a lens 965, and the like. The imaging device of one embodiment of the present invention can be used in the digital camera.

Figure 24F:
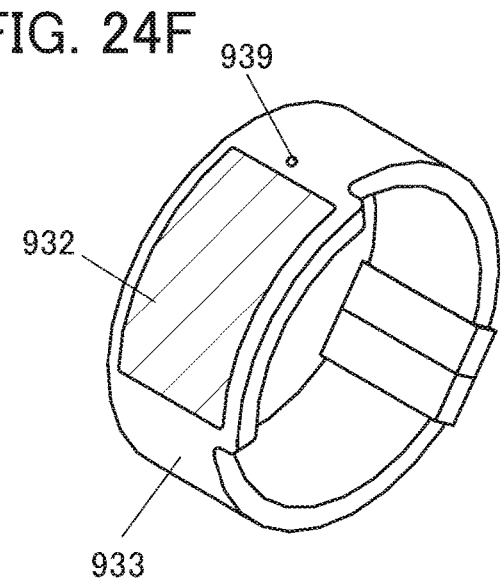

FIG. 24F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention can be used in the information terminal.

Figure 25A:
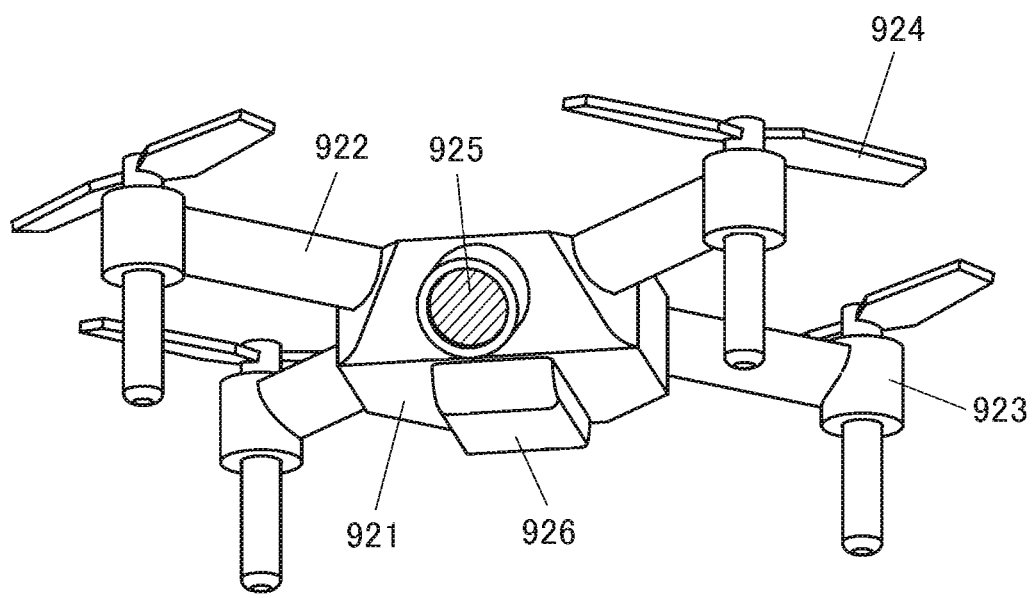
FIG. 25A and FIG. 25B are diagrams each illustrating a moving object.

FIG. 25A is a drone as an example of a moving vehicle, which includes a frame 921, an arm 922, a rotor 923, a blade 924, a camera 925, a battery 926, and the like and has a function of flying autonomously, a function of staying still in midair, and the like. The imaging device of one embodiment of the present invention can be used in the camera 925.

Figure 25B:
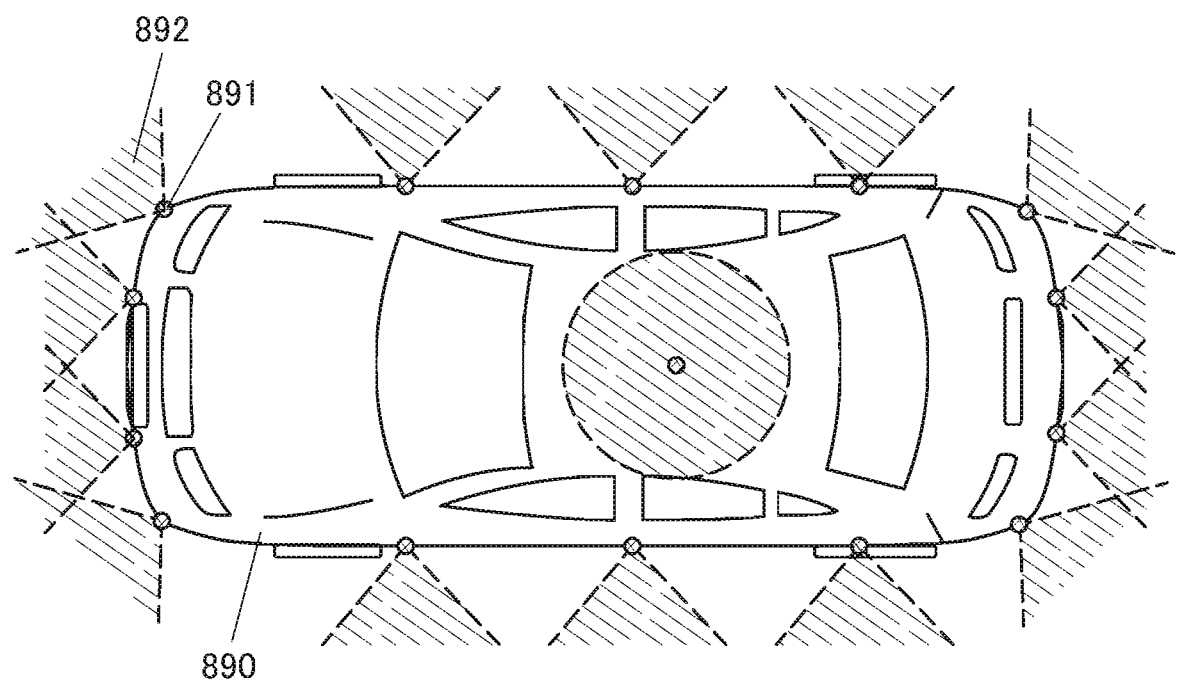

FIG. 25B illustrates an external view of an automobile as an example of a moving vehicle. An automobile 890 includes a plurality of cameras 891 and the like, and can obtain information on the front, rear, left, and right sides and the upper side of the automobile 890. The imaging device of one embodiment of the present invention can be used in the cameras 891. The automobile 890 is also provided with various sensors such as an infrared radar, a millimeter wave radar, and a laser radar (not illustrated) and the like. The automobile 890 judges traffic conditions therearound such as the presence of a guardrail or a pedestrian by analyzing images in a plurality of image capturing directions 892 taken by the cameras 891, and thus can perform autonomous driving. It can also be used for a system for navigation, risk prediction, or the like.

When arithmetic processing with a neural network or the like is performed on the obtained image data in the imaging device of one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and reduction of glare and reflection can be performed.

Note that the automobile may be any of an automobile having an internal-combustion engine, an electric vehicle, a hydrogen vehicle, and the like. Furthermore, the moving vehicle is not limited to an automobile. Examples of the moving vehicle also include a train, a monorail train, a ship, and a flying vehicle (a helicopter, an unmanned aircraft, an airplane, and a rocket), and these moving vehicles can include a system utilizing artificial intelligence when equipped with a computer of one embodiment of the present invention.

This embodiment can be combined with the description of the other embodiments as appropriate.

REFERENCE NUMERALS

71: curve, 72: curve, 102: transistor, 103: transistor, 104: transistor, 105: transistor, 106: transistor, 108: capacitor, 115: transistor, 116: transistor, 121: wiring, 122: wiring, 123: wiring, 126: wiring, 127: wiring, 128: wiring, 129: wiring, 131: conductive layer, 132: conductive layer, 133: conductive layer, 134: conductive layer, 135: conductive layer, 136: conductive layer, 137: conductive layer, 138: conductive layer, 139: conductive layer, 141: conductive layer, 142: conductive layer, 143: conductive layer, 145: conductive layer, 146: conductive layer, 147: conductive layer, 148: conductive layer, 201: layer, 202: layer, 203: layer, 204: layer, 205: layer, 210: region, 211: silicon substrate, 212: insulating layer, 213: insulating layer, 214: insulating layer, 215: insulating layer, 216: insulating layer, 217: insulating layer, 218: insulating layer, 219: insulating layer, 220: region, 221: insulating layer, 222: insulating layer, 223: insulating layer, 224: insulating layer, 225: insulating layer, 226: ferroelectric layer, 227: insulating layer, 228: insulating layer, 229: insulating layer, 230: region, 231: insulating layer, 232: insulating layer, 233: insulating layer, 234: insulating layer, 235: insulating layer, 236: insulating layer, 237: insulating layer, 240: photoelectric conversion device, 241: insulating layer, 242: insulating layer, 243: p-type region, 244: n-type region, 245: insulating layer, 246: insulating layer, 249: insulating layer, 250: optical conversion layer, 250B: color filter, 250G: color filter, 250IR: infrared filter, 250R: color filter, 250UV: ultraviolet filter, 251: light-blocking layer, 255: microlens array, 261: insulating layer, 262: insulating layer, 271: transistor, 272: transistor, 273: transistor, 274: capacitor, 275: capacitor, 276: transistor, 277: capacitor, 311: circuit, 312: row driver, 313: column driver, 314: circuit, 321: memory circuit, 321a: memory cell, 321b: memory cell, 321c: memory cell, 321d: memory cell, 321e: memory cell, 331: pixel circuit, 332: driver circuit, 351: wiring, 352: wiring, 353: wiring, 354: wiring, 355: wiring, 400: CDS circuit, 401: resistor, 402: capacitor, 403: transistor, 404: transistor, 405: capacitor, 410: A/D converter, 535: back gate, 545: semiconductor layer, 546: insulating layer, 610: region, 620: region, 630: region, 701: gate electrode, 702: gate insulating film, 703: source region, 704: drain region, 705: source electrode, 706: drain electrode, 707: oxide semiconductor layer, 810: bump, 815: back electrode, 820: via through electrode, 825: electrode pad, 830: adhesive, 840: cover glass, 850: bare chip, 855: pixel array, 860: lens cover, 870: lens, 880: optical filter, 890: automobile, 891: camera, 892: image capturing direction, 911: housing, 912: display portion, 913: speaker, 919: camera, 921: frame, 922: arm, 923: rotor, 924: blade, 925: camera, 926: battery, 932: display portion, 933: housing and wristband, 939: camera, 941: frame, 942: camera, 943: operation button, 944: part, 951: support base, 952: camera unit, 953: protection cover, 961: housing, 962: shutter button, 963: microphone, 965: lens, 967: light-emitting portion, 981: housing, 982: display portion, 983: operation button, 984: external connection port, 985: speaker, 986: microphone, 987: camera

The invention claimed is:

1. An imaging device comprising:
a first layer comprising a reading circuit over a substrate;
a second layer over the first layer, the second layer comprising:
a memory circuit;
a first insulating layer over the memory circuit; and
a first conductive layer embedded in the first insulating layer;
a third layer over the second layer, the third layer comprising:
a second insulating layer in contact with the first insulating layer;
a second conductive layer embedded in the second insulating layer; and
a pixel circuit over the second conductive layer; and
a fourth layer comprising a photoelectric conversion device over the third layer,
wherein the photoelectric conversion device is electrically connected to the pixel circuit,
wherein the memory circuit is electrically connected to the reading circuit,
wherein the first conductive layer is electrically connected to the reading circuit,
wherein the second conductive layer is electrically connected to the pixel circuit,
wherein the first conductive layer and the second conductive layer are directly bonded to each other,
wherein the memory circuit comprises a memory cell, and
wherein the memory cell comprises a capacitor including a ferroelectric layer.

2. The imaging device according to claim 1,
wherein the pixel circuit and the memory circuit each comprise a transistor including a metal oxide in a channel formation region,
wherein the reading circuit comprises a transistor including silicon in a channel formation region, and
wherein the photoelectric conversion device is a photodiode including silicon in a photoelectric conversion layer.

3. The imaging device according to claim 2,
wherein the metal oxide comprises In, Zn, and M (M is one or more of Al, Ti, Ga, Ge, Sn, Y, Zr, La, Ce, Nd, and Hf).

4. The imaging device according to claim 1,
wherein the pixel circuit, the memory circuit, and the reading circuit each comprise a transistor including silicon in a channel formation region, and
wherein the photoelectric conversion device is a photodiode including silicon in a photoelectric conversion layer.

5. The imaging device according to claim 1,
wherein the first conductive layer and the second conductive layer are formed using the same metal material, and
wherein the first insulating layer and the second insulating layer are formed using the same insulating material.

6. The imaging device according to claim 1,
wherein the ferroelectric layer is a metal oxide including Hf and Zr.

7. An electronic device comprising the imaging device according to claim 1, and a display device.

8. An imaging device comprising:
a first layer comprising a reading circuit over a substrate;
a second layer over the first layer, the second layer comprising:
  a memory circuit;
  a first insulating layer over the memory circuit; and
  a first conductive layer embedded in the first insulating layer;
a third layer over the second layer, the third layer comprising:
  a second insulating layer in contact with the first insulating layer;
  a second conductive layer embedded in the second insulating layer; and
  a pixel circuit over the second conductive layer; and
a fourth layer comprising a photoelectric conversion device over the third layer,
wherein the photoelectric conversion device is electrically connected to the pixel circuit,
wherein the memory circuit is electrically connected to the reading circuit,
wherein the first conductive layer is electrically connected to the reading circuit,
wherein the second conductive layer is electrically connected to the pixel circuit, and
wherein the first conductive layer and the second conductive layer are directly bonded to each other.

9. The imaging device according to claim 8,
wherein the pixel circuit and the memory circuit each comprise a transistor including a metal oxide in a channel formation region,
wherein the reading circuit comprises a transistor including silicon in a channel formation region, and
wherein the photoelectric conversion device is a photodiode including silicon in a photoelectric conversion layer.

10. The imaging device according to claim 9,
wherein the metal oxide comprises In, Zn, and M (M is one or more of Al, Ti, Ga, Ge, Sn, Y, Zr, La, Ce, Nd, and Hf).

* * * * *